(12) United States Patent
Kim et al.

(10) Patent No.: US 12,501,827 B2
(45) Date of Patent: Dec. 16, 2025

(54) ORGANIC LIGHT EMITTING DIODE DEVICE

(71) Applicants: LG DISPLAY CO., LTD., Seoul (KR); ROHM AND HAAS ELECTRONIC MATERIALS KOREA LTD., Cheonan-si (KR)

(72) Inventors: Dohan Kim, Goyang-si (KR); Hyeseung Kang, Seoul (KR); Kyoung-Jin Park, Hwaseong-si (KR); Ji-Song Jun, Hwaseong-si (KR); Chi-Sik Kim, Hwaseong-si (KR)

(73) Assignees: LG DISPLAY CO., LTD., Seoul (KR); ROHM AND HAAS ELECTRONIC MATERIALS KOREA LTD., Cheonan-si (KR)

( * ) Notice: Subject to any disclaimer, the term of this patent is extended or adjusted under 35 U.S.C. 154(b) by 402 days.

(21) Appl. No.: 17/039,462

(22) Filed: Sep. 30, 2020

(65) Prior Publication Data
US 2021/0104692 A1 Apr. 8, 2021

(30) Foreign Application Priority Data
Oct. 2, 2019 (KR) .................. 10-2019-0121947

(51) Int. Cl.
*H10K 85/60* (2023.01)
*H10K 50/125* (2023.01)
*H10K 101/00* (2023.01)

(52) U.S. Cl.
CPC ......... *H10K 85/654* (2023.02); *H10K 50/125* (2023.02); *H10K 85/622* (2023.02);
(Continued)

(58) Field of Classification Search
CPC ............. H01L 51/0056; H01L 51/0059; H01L 51/006; H01L 51/0061; H01L 51/0067;
(Continued)

(56) References Cited

U.S. PATENT DOCUMENTS

| 9,966,541 B2 | 5/2018 | Yamamoto et al. |
| 2004/0150352 A1* | 8/2004 | Koide .................. G09G 3/3258 315/169.3 |

(Continued)

FOREIGN PATENT DOCUMENTS

| JP | 6100368 B2 | 3/2017 |
| KR | 20140079273 A | 6/2014 |

(Continued)

OTHER PUBLICATIONS

Su et al. Adv. Mater. 2003, 15, No. 11, Jun. 5, 2003.*
Hofbeck et al. Inorg. Chem. 2010, 49, 9290-9299 (Year: 2010).*
Lamansky et al., Inorganic Chemistry, vol. 40, No. 7, 2001 (Year: 2001).*

*Primary Examiner* — Elizabeth M. Dahlburg
(74) *Attorney, Agent, or Firm* — Seed Intellectual Property Law Group LLP

(57) ABSTRACT

Disclosed herein is an organic light emitting diode device. The organic light emitting diode device includes an anode, a cathode and a light emitting layer. The light emitting layer has a structure where a blue light emitter and a red/green simultaneous light emitter are stacked. The red/green simultaneous light emitter has a structure where a red light emitter and a green light emitter are stacked. The red light emitter includes a red host compound, and in some embodiments, the red host compound includes a spirobisfluorene-based compound where an aryl amino group is substituted. The green light emitter includes a green host compound, and the green host compound includes a mixture of a first green host compound and a second green host compound. In some embodiments, the first green host compound includes a
(Continued)

biscarbazole-based compound and the second green host compound includes an indolocarbazole-based compound.

4 Claims, 9 Drawing Sheets

(52) U.S. Cl.
CPC ......... *H10K 85/633* (2023.02); *H10K 85/636* (2023.02); *H10K 85/6572* (2023.02); *H10K 2101/90* (2023.02)

(58) Field of Classification Search
CPC ............. H01L 51/0072; H01L 51/5036; H01L 51/5384; H10K 85/342; H10K 85/615; H10K 85/622; H10K 85/624; H10K 85/633; H10K 85/636; H10K 85/654; H10K 85/657; H10K 85/6572; H10K 50/11; H10K 50/12; H10K 50/125; C09K 11/06

See application file for complete search history.

(56) References Cited

U.S. PATENT DOCUMENTS

| | | | |
|---|---|---|---|
| 2010/0244004 A1* | 9/2010 | Xia | H05B 33/10 546/4 |
| 2013/0207046 A1* | 8/2013 | Pflumm | C07D 307/91 252/500 |
| 2014/0167016 A1* | 6/2014 | Yoo | H01L 51/5056 257/40 |
| 2017/0117488 A1* | 4/2017 | Ahn | H01L 51/0073 |
| 2018/0033994 A1* | 2/2018 | Jang | H10K 50/11 |
| 2018/0138420 A1* | 5/2018 | Tada | C07D 209/86 |
| 2018/0254426 A1 | 9/2018 | Ikenaga et al. | |
| 2018/0301636 A1* | 10/2018 | Park | H01L 51/0072 |

FOREIGN PATENT DOCUMENTS

| | | | |
|---|---|---|---|
| KR | 10-2017-0134490 A | 12/2017 | |
| WO | WO-2013120577 A1 * | 8/2013 | ............. C07C 21/54 |

\* cited by examiner

ORGANIC LIGHT EMITTING DIODE DEVICE

CROSS-REFERENCE TO RELATED APPLICATION

The present disclosure claims priority to and the benefit of Korean Patent Application No. 10-2019-0121947, filed on Oct. 2, 2019, the disclosure of which is incorporated herein by reference in its entirety.

BACKGROUND

Technical Field

The present disclosure relates to an organic light emitting diode device.

Description of the Related Art

Organic light emitting diode devices are a self-light emitting diode device that can convert electric energy into light energy using an organic material. In general, they have a structure where an organic layer is disposed between an anode and a cathode.

When a voltage is applied between the anode and the cathode, holes from the anode and electrons from the cathode are injected into the organic layer. Then the holes and the electrons meet, and excitons are generated. When the excitons fall into the ground state, light is emitted.

The organic layer usually has a multilayered structure comprising different materials for improvement in efficiency and stability of the organic light emitting diode device. For example, the organic layer can comprise a hole injecting layer, a hole transporting layer, a light emitting layer, an electron transporting layer, an electron injecting layer and the like.

BRIEF SUMMARY

The present disclosure is directed to a white light-emitting organic light emitting diode device capable of ensuring improved color purity and color gamut.

Objectives of the present disclosure are not limited to the above ones, and objectives that have not been mentioned may be clearly understood from the following description by one having ordinary skill in the art to which the disclosure pertains.

According to the present disclosure, an organic light emitting diode device may be provided with a light emitting layer having a structure in which a blue light emitter and a red/green simultaneous light emitter are stacked. The red/green simultaneous light emitter may have a structure in which a red light emitter and a green light emitter are stacked. The green light emitter may be disposed closer to a cathode than the red light emitter. In other words, the organic light emitting diode device may comprise an anode, a cathode and the light emitting layer, and the green light emitter may be disposed between the red light emitter and the cathode.

The red light emitter may comprise a red host compound represented by the following Chemical Formula 1, and a red phosphorescence light emitting dopant.

The green light emitter may comprise a green host compound and a green phosphorescence light emitting dopant. The green host compound may comprise a mixture of a first green host compound represented by the following Chemical Formula 2 and a second green host compound represented by the following Chemical Formula 3.

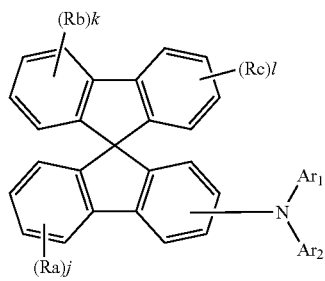

Chemical Formula 1

In the above Chemical Formula 1, Ra, Rb and Rc may be independently any one selected from hydrogen, heavy hydrogen, halogen, a substituted or unsubstituted $C_{1-6}$ alkyl group, a substituted or unsubstituted $C_{3-6}$ cycloalkyl group, a substituted or unsubstituted $C_{6-15}$ aryl group, a substituted or unsubstituted $C_{5-9}$ heteroaryl group, a substituted or unsubstituted carbazole group, a substituted or unsubstituted dibenzofuran group, a substituted or unsubstituted dibenzothiophene group, a substituted or unsubstituted trialkylsilyl group and a substituted or unsubstituted triarylsilyl group.

In the above Chemical Formula 1, j, k and l may be independently an integer from 1 to 4.

In the above Chemical Formula 1, $Ar_1$ and $Ar_2$ may be independently any one selected from a substituted or unsubstituted phenyl group, a substituted or unsubstituted biphenyl group, a substituted or unsubstituted terphenyl group, a substituted or unsubstituted naphthyl group, a substituted or unsubstituted phenanthryl group, a substituted or unsubstituted fluorenyl group, a substituted or unsubstituted triphenylenyl group, a substituted or unsubstituted dibenzofuranyl group and a substituted or unsubstituted dibenzothiophenyl group.

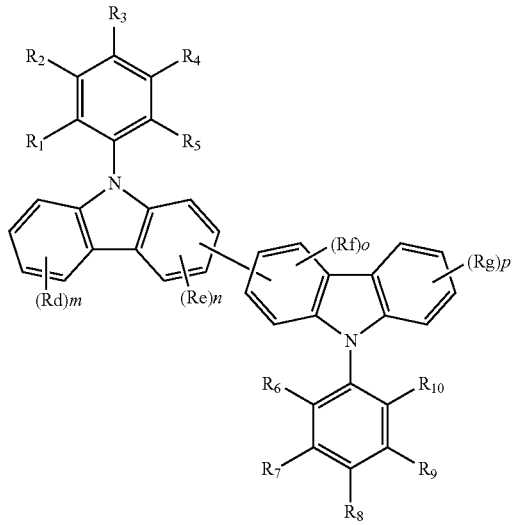

Chemical Formula 2

In the above Chemical Formula 2, Rd, Re, Rf and Rg may be r independently any one selected from hydrogen, heavy hydrogen, halogen, a substituted or unsubstituted $C_{1-6}$ alkyl group, a substituted or unsubstituted $C_{3-6}$ cycloalkyl group, a substituted or unsubstituted $C_{6-15}$ aryl group, a substituted or unsubstituted $C_{5-9}$ heteroaryl group, a substituted or unsubstituted carbazole group, a substituted or unsubstituted dibenzofuran group, a substituted or unsubstituted dibenzothiophene group, a substituted or unsubstituted trialkylsilyl group and a substituted or unsubstituted triarylsilyl group.

In the above Chemical Formula 2, m and p may be independently an integer from 1 to 4, and n and o may be independently an integer from 1 to 3.

In the above Chemical Formula 2, $R_1$, $R_2$, $R_3$, $R_4$, $R_5$, $R_6$, $R_7$, $R_8$, $R_9$ and $R_{10}$ may be independently any one selected from hydrogen, heavy hydrogen, halogen, a substituted or unsubstituted $C_{1-6}$ alkyl group, a substituted or unsubstituted $C_{6-15}$ aryl group, a substituted or unsubstituted carbazole group, a substituted or unsubstituted dibenzofuran group and a substituted or unsubstituted dibenzothiophene group.

Chemical Formula 3

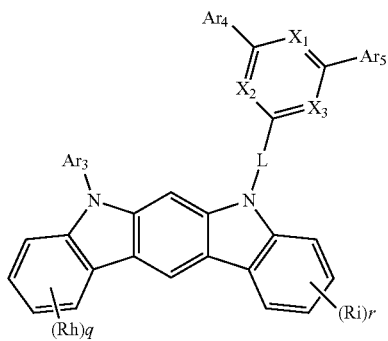

In the above Chemical Formula 3, Rh and Ri may be independently any one selected from hydrogen, heavy hydrogen, halogen, a substituted or unsubstituted $C_{1-6}$ alkyl group, a substituted or unsubstituted $C_{3-6}$ cycloalkyl group, a substituted or unsubstituted $C_{6-15}$ aryl group, a substituted or unsubstituted $C_{5-9}$ heteroaryl group, a substituted or unsubstituted carbazole group, a substituted or unsubstituted dibenzofuran group, a substituted or unsubstituted dibenzothiophene group, a substituted or unsubstituted trialkylsilyl group and a substituted or unsubstituted triarylsilyl group.

In the above Chemical Formula 3, q and r may be independently an integer from 1 to 4.

In the above Chemical Formula 3, $Ar_3$, $Ar_4$ and $Ar_5$ may be independently any one selected from a substituted or unsubstituted phenyl group, a substituted or unsubstituted biphenyl group, a substituted or unsubstituted terphenyl group, a substituted or unsubstituted naphthyl group, a substituted or unsubstituted phenanthryl group, a substituted or unsubstituted fluorenyl group, a substituted or unsubstituted triphenylenyl group, a substituted or unsubstituted dibenzofuranyl group and a substituted or unsubstituted dibenzothiophenyl group.

In the above Chemical Formula 3, L may be any one selected from a single bond, a phenyl group, a naphthyl group and a pyridyl group.

In the above Chemical Formula 3, $X_1$, $X_2$ and $X_3$ may be independently N or CH, provided that at least two of $X_1$, $X_2$ and $X_3$ are N.

Details in relation to the other embodiments are included in the detailed description and the drawings.

The present disclosure includes at least the following effect.

According to the present disclosure, provided is a white light-emitting organic light emitting diode device that may satisfy a color coordinate required for implementing high color purity and wide color gamut.

Effects according to the present disclosure are not limited to the above ones, and various other effects may be included in the disclosure.

BRIEF DESCRIPTION OF THE DRAWINGS

The accompanying drawings constitute a part of this specification, illustrate one or more embodiments of the present disclosure, and together with the specification, explain the present disclosure, wherein.

DETAILED DESCRIPTION

Figure 1:
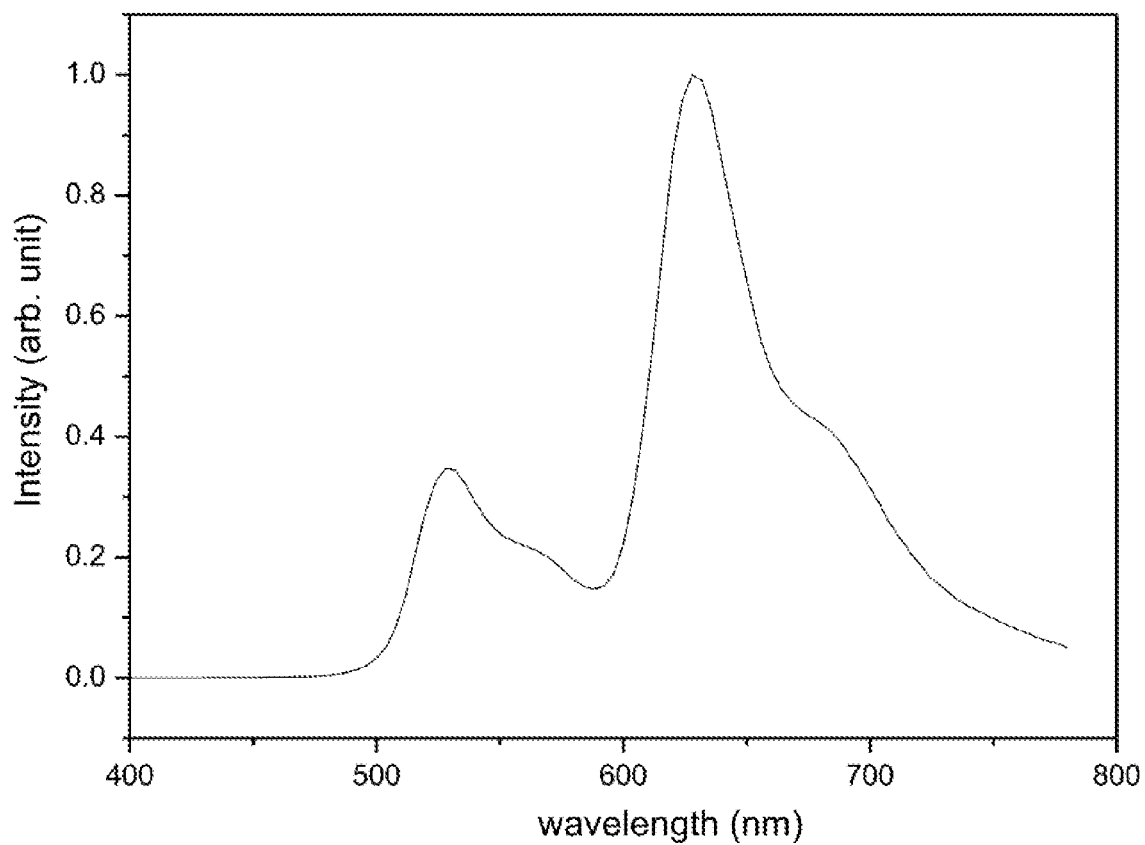
FIG. 1 shows an image of a light emitting spectrum of an organic light emitting diode device on the basis of Comparative Example 1.

Advantages and features according to the present disclosure, and a method of achieving the same may be clearly understood from the following embodiments that are specifically described with reference to the accompanying drawings. Additionally, the drawings are provided only for a better understanding of the technical spirit in the disclosure and are not construed as limiting the technical spirit.

Further, the present disclosure should not be construed as being limited to the details set forth herein. Rather, the present disclosure is intended to cover various modifications. The details set forth herein are provided as examples so that the present disclosure will be thorough and complete and that the scope of the disclosure will be fully conveyed to one having ordinary skill in the art to which the disclosure pertains. The present disclosure should be defined only according to the scope of the appended claims.

In relation to descriptions of the disclosure, detailed description of known technologies and the like regarding the disclosure is omitted if it is deemed to make the gist of the present disclosure unnecessarily vague.

In describing components, terms such as first, second, and the like may be used. These terms are only intended to distinguish a component from another component, and the components are not limited to such terms. Certainly, unless explicitly stated otherwise, a first component may denote a second component.

Unless explicitly stated to the contrary, each component may denote a single component or a plurality of components throughout the specification.

Throughout the specification, unless explicitly described to the contrary, the terms "comprise," "include" and "have" should imply the inclusion of any other component but not the exclusion of any other component.

In the specification, "$C_{A-B}$" denotes a hydrocarbon group or a hydrocarbon derivative group and the like where the number of carbons is A or greater and B or less, and "A to B" denotes A or greater and B or less.

In the specification, the term "substituted" denotes that "at least one hydrogen of a hydrocarbon compound or a hydrocarbon derivative is substituted with a hydrocarbon group, a hydrocarbon derivative group, a halogen group or a cyano group (—CN) and the like," and the term "non-substituted" denotes that "at least one hydrogen of a hydrocarbon compound or a hydrocarbon derivative is not substituted with a hydrocarbon group, a hydrocarbon derivative group, a halogen group or a cyano group (—CN) and the like." Examples of the hydrocarbon group, or the hydrocarbon derivative group include $C_{1-6}$ alkyl, $C_{2-6}$ alkenyl, $C_{2-6}$ alkinyl, $C_{6-15}$ aryl, $C_{1-6}$ alkyl and $C_{6-15}$ aryl, $C_{6-15}$ aryl and $C_{1-6}$ alkyl, $C_{1-6}$ alkylamido, $C_{6-15}$ arylamido, $C_{1-6}$ alkylidene and the like, but not limited.

According to the present disclosure, provided is a white light-emitting organic light emitting diode device that may implement white light using three primary colors of light and that may ensure improved color purity and color gamut.

The organic light emitting diode device may comprise an anode, a cathode, and a light emitting layer. The light emitting layer may have a structure where a blue light emitter, a red light emitter, and a green light emitter are stacked. In other words, the light emitting layer may have a structure where a blue light emitter and a red/green simultaneous light emitter are stacked, and the red/green simultaneous light emitter may have a structure where a red light emitter and a green light emitter are stacked.

The organic light emitting diode device may implement white light using three primary colors of light emitted from the blue light emitter and the red/green simultaneous light emitter. A color coordinate of white light may be determined on the basis of a color coordinate of the blue light emitter and a color coordinate of the red/green simultaneous light emitter. In case mobility of holes injected into the red/green simultaneous light emitter is not balanced with mobility of electrons injected into the red/green simultaneous light emitter, it is difficult to implement white light using three primary colors of light emitted from the blue light emitter and the red/green simultaneous light emitter.

In case mobility of holes induced into the red/green simultaneous light emitter is higher than mobility of electrons induced into the red/green simultaneous light emitter, the red/green simultaneous light emitter may emit greenish-yellow light.

In case mobility of electrons induced into the red/green simultaneous light emitter is higher than mobility of holes induced into the red/green simultaneous light emitter, the red/green simultaneous light emitter may emit reddish-yellow light.

For example, in order for the red/green simultaneous light emitter to emit yellow-green light, mobility of holes induced into the red/green simultaneous light emitter has to be balanced with mobility of electrons induced into the red/green simultaneous light emitter.

It is difficult to strike a balance between mobility of holes and mobility of electrons in the red/green simultaneous light emitter. Accordingly, it is also difficult to implement white light using the blue light emitter and the red/green simultaneous light emitter.

Charge mobility of a host material is directly related with a molecular structure. Applicants of the disclosure could balance mobility of holes with mobility of electrons in the red/green simultaneous light emitter on the basis of an organic combination of a host material used for the red light emitter and a host material used for the green light emitter.

The red light emitter may comprise a red host compound represented by Chemical Formula 1 below and a red phosphorescent light emitting dopant.

Chemical Formula 1

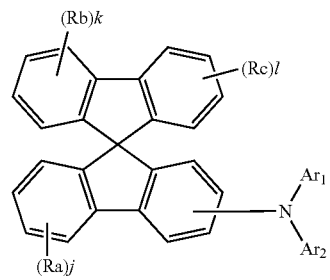

In the above Chemical Formula 1, Ra, Rb and Rc may be independently any one selected from hydrogen, heavy hydrogen, halogen, a substituted or unsubstituted $C_{1-6}$ alkyl group, a substituted or unsubstituted $C_{3-6}$ cycloalkyl group, a substituted or unsubstituted $C_{6-15}$ aryl group, a substituted or unsubstituted $C_{5-9}$ heteroaryl group, a substituted or unsubstituted carbazole group, a substituted or unsubstituted dibenzofuran group, a substituted or unsubstituted dibenzothiophene group, a substituted or unsubstituted trialkylsilyl group and a substituted or unsubstituted triarylsilyl group.

In the above Chemical Formula 1, j, k and l may be independently an integer from 1 to 4.

In the above Chemical Formula 1, $Ar_1$ and $Ar_2$ may be independently any one selected from a substituted or unsubstituted phenyl group, a substituted or unsubstituted biphenyl group, a substituted or unsubstituted terphenyl group, a substituted or unsubstituted naphthyl group, a substituted or unsubstituted phenanthryl group, a substituted or unsubstituted fluorenyl group, a substituted or unsubstituted triphenylenyl group, a substituted or unsubstituted dibenzofuranyl group and a substituted or unsubstituted dibenzothiophenyl group.

For example, examples of the red host compound include RH-1 to RH-12 below, and the red host compound may comprise at least one of the below-described RH-1 to RH-12.

RH-1
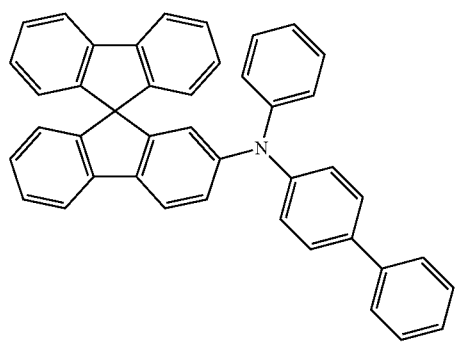
RH-4
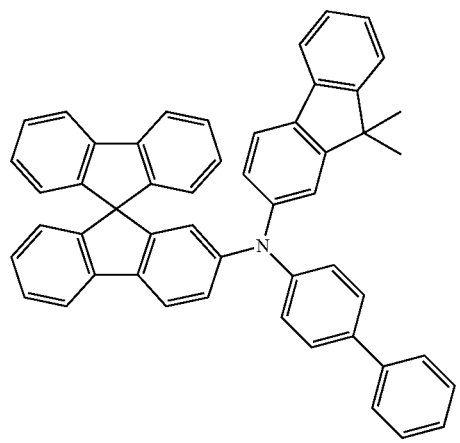
RH-2
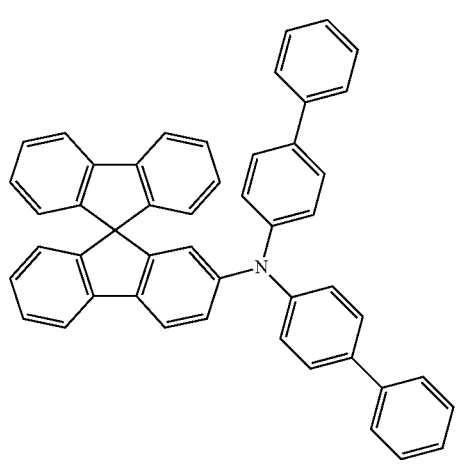
RH-5
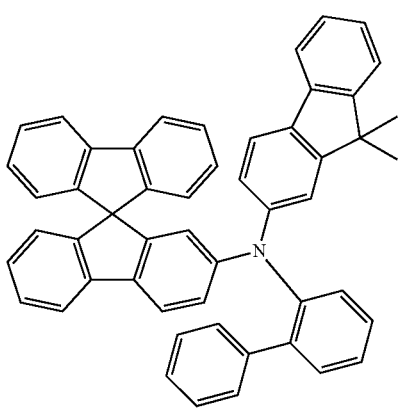
RH-3
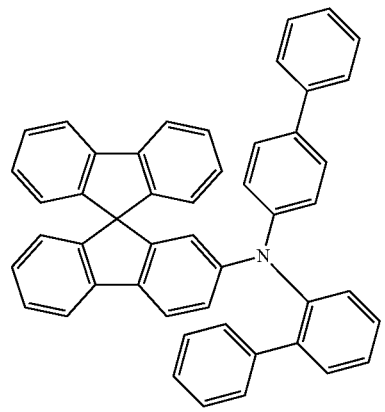
RH-6
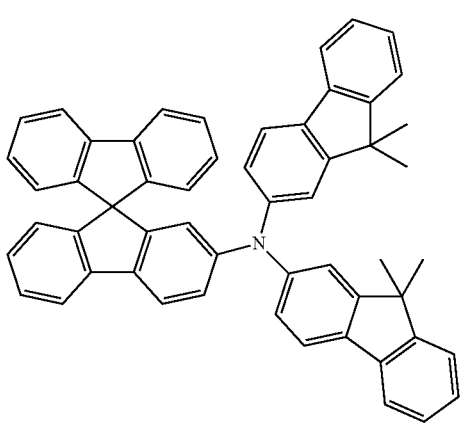

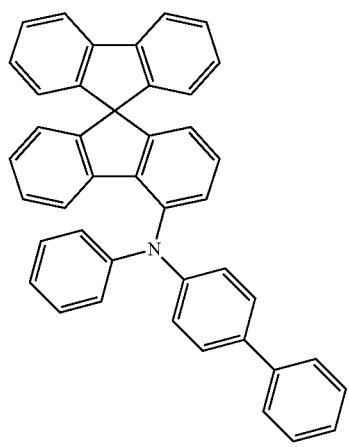
RH-7
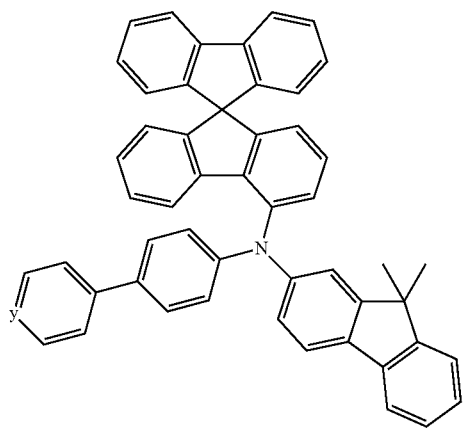
RH-10
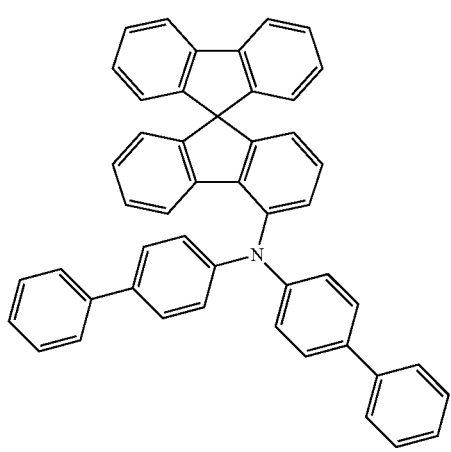
RH-8
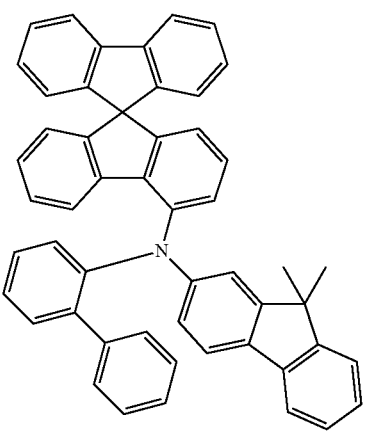
RH-11
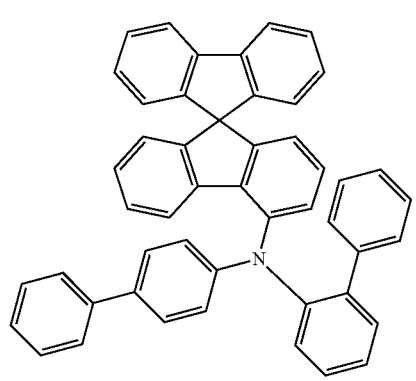
RH-9
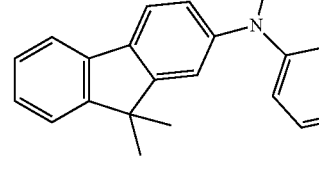
RH-12
The green light emitter may comprise a green host compound and a green phosphorescent light emitting dopant. The green host compound may comprise a mixture of a first green host compound represented by Chemical Formula 2 below and a second green host compound represented by Chemical Formula 3 below.

Chemical Formula 2

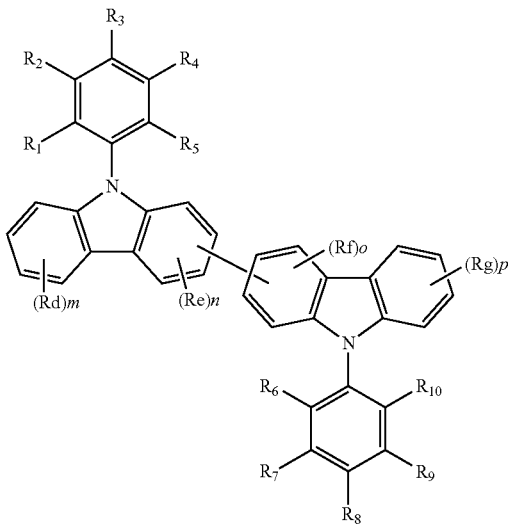

In the above Chemical Formula 2, Rd, Re, Rf and Rg may be independently any one selected from hydrogen, heavy hydrogen, halogen, a substituted or unsubstituted $C_{1-6}$ alkyl group, a substituted or unsubstituted $C_{3-6}$ cycloalkyl group, a substituted or unsubstituted $C_{6-15}$ aryl group, a substituted or unsubstituted $C_{5-9}$ heteroaryl group, a substituted or unsubstituted carbazole group, a substituted or unsubstituted dibenzofuran group, a substituted or unsubstituted dibenzothiophene group, a substituted or unsubstituted trialkylsilyl group and a substituted or unsubstituted triarylsilyl group.

In the above Chemical Formula 2, m and p may be independently an integer from 1 to 4, and n and o may be independently an integer from 1 to 3.

In the above Chemical Formula 2, $R_1$, $R_2$, $R_3$, $R_4$, $R_5$, $R_6$, $R_7$, $R_8$, $R_9$ and $R_{10}$ may be independently any one selected from hydrogen, heavy hydrogen, halogen, a $C_{1-6}$ alkyl group, a substituted or unsubstituted $C_{6-15}$ aryl group, a substituted or unsubstituted carbazole group, a substituted or unsubstituted dibenzofuran group and a substituted or unsubstituted dibenzothiophene group.

For example, examples of the first green host compound may include GHA-1 to GHA-44 below. The first green host compound may comprise at least one of the below-described GHA-1 to GHA-44.

GHA-1

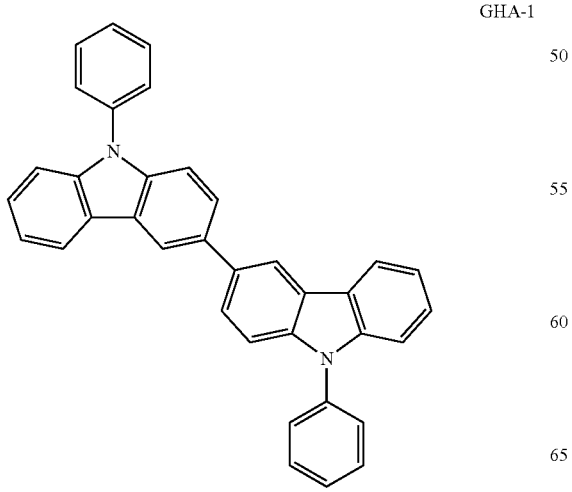

GHA-2

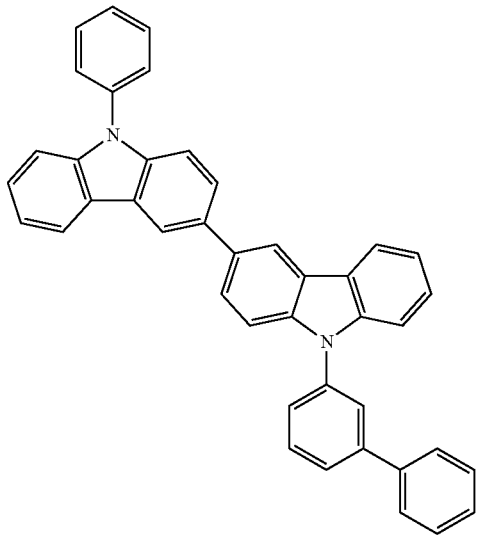

GHA-3

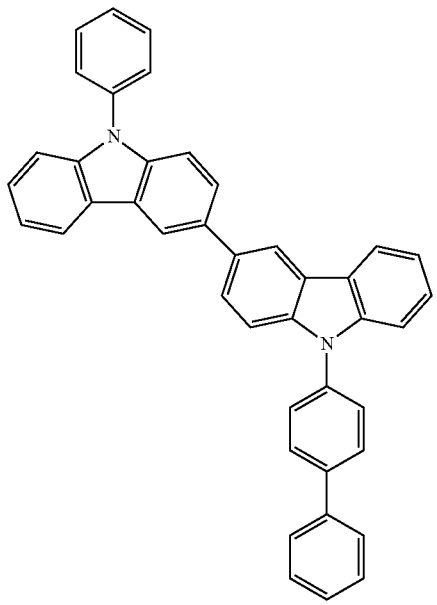

GHA-4
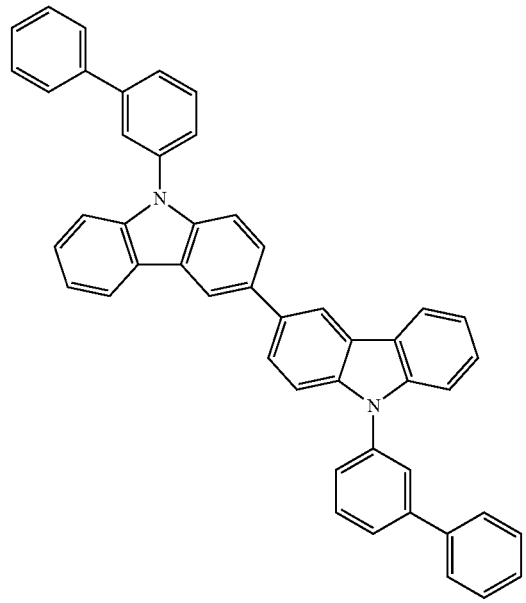
GHA-5
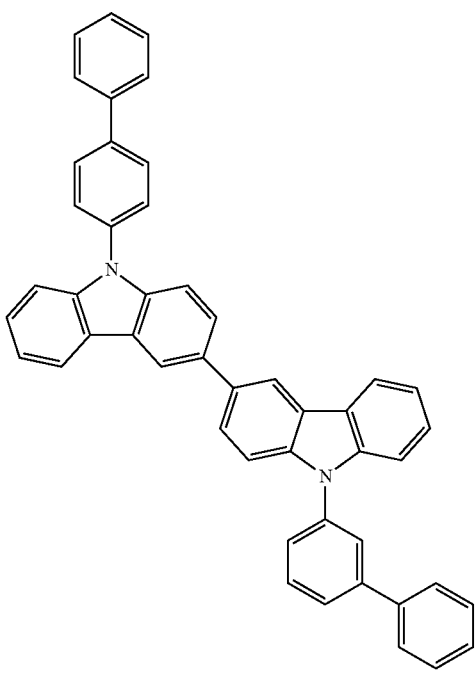
GHA-6
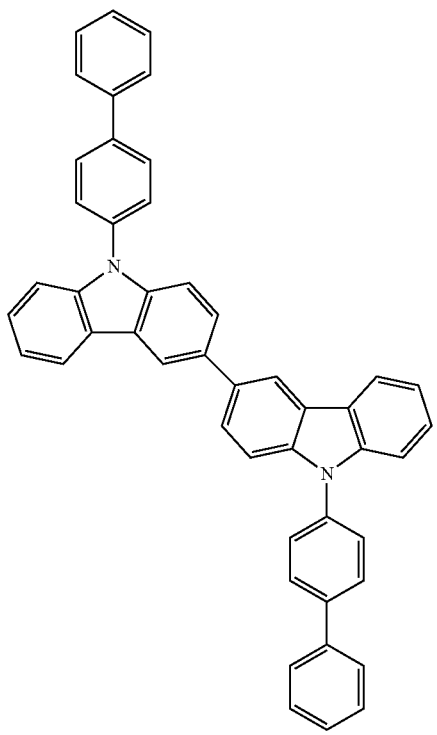
GHA-7
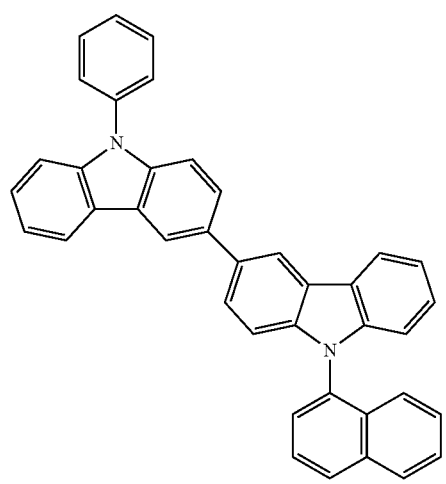

GHA-8
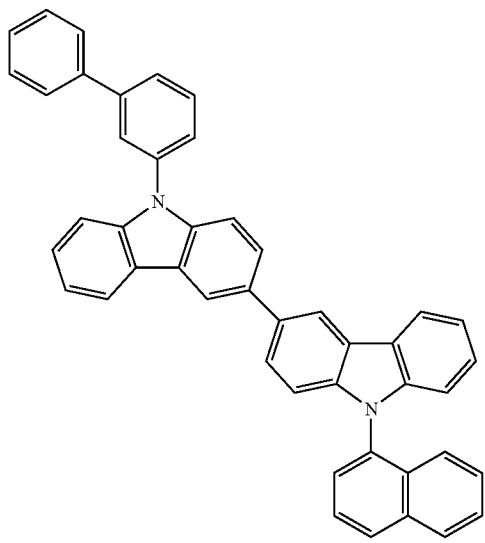
GHA-10
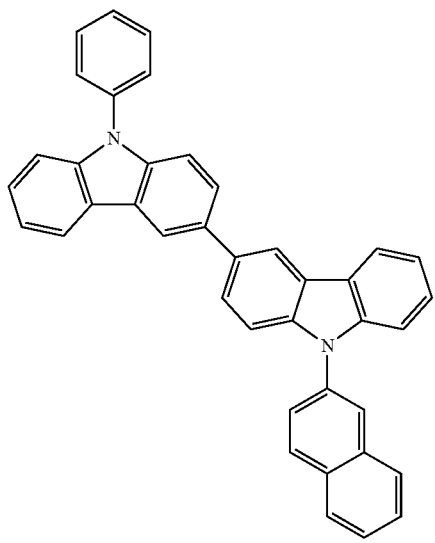
GHA-9
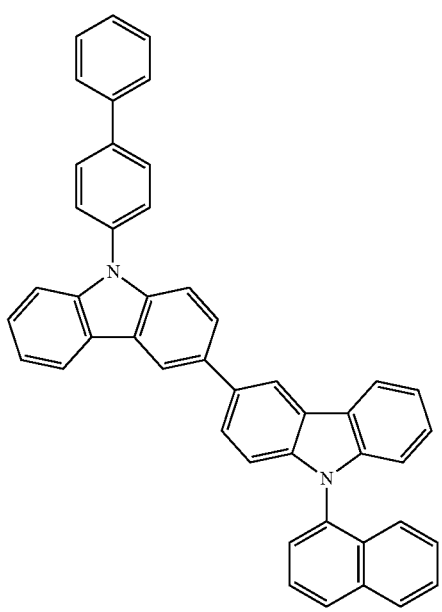
GHA-11
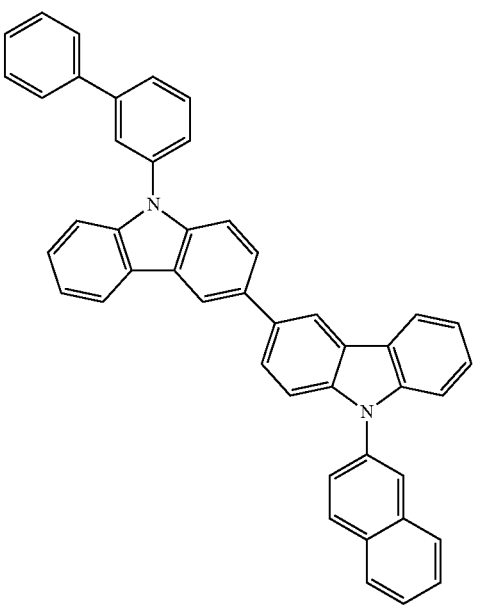

GHA-12
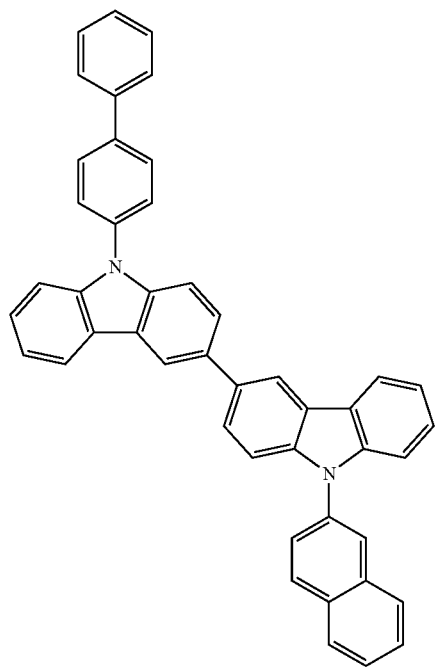
GHA-13
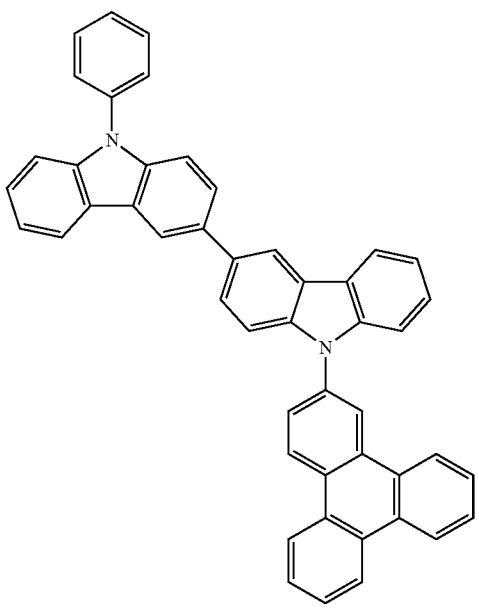
GHA-14
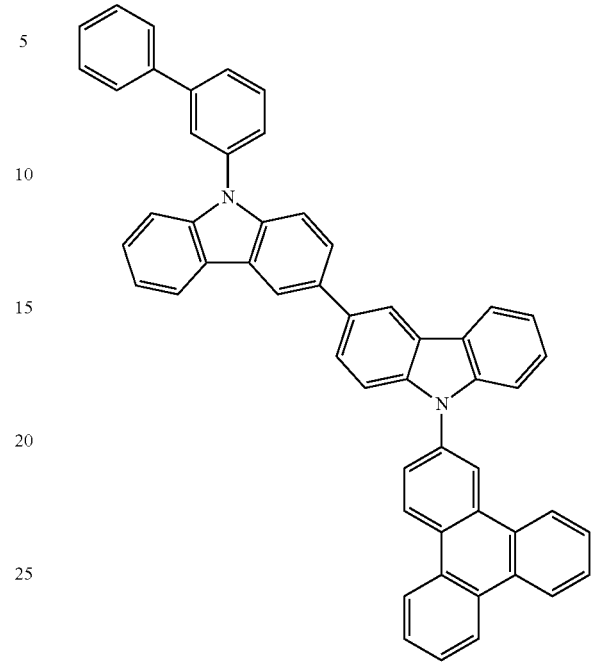
GHA-15
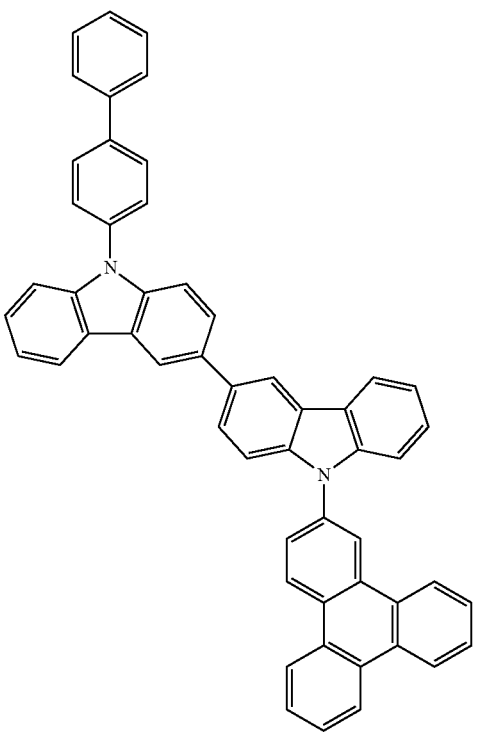

GHA-16
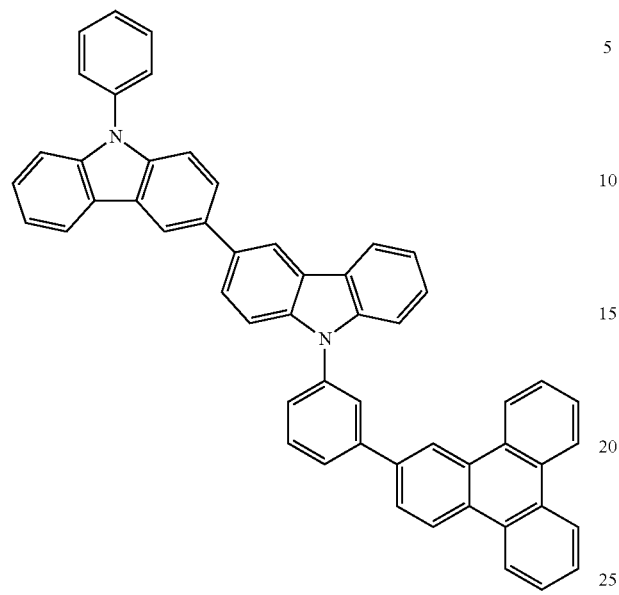
GHA-18
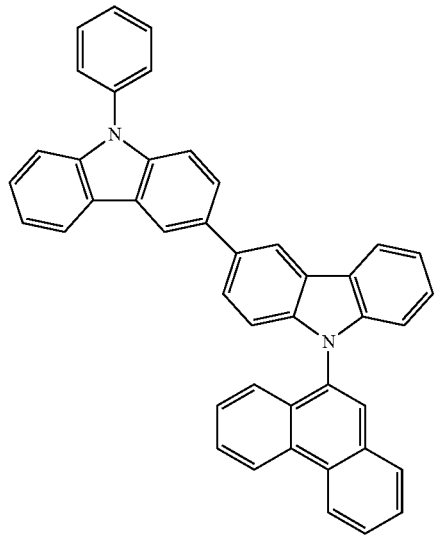
GHA-17
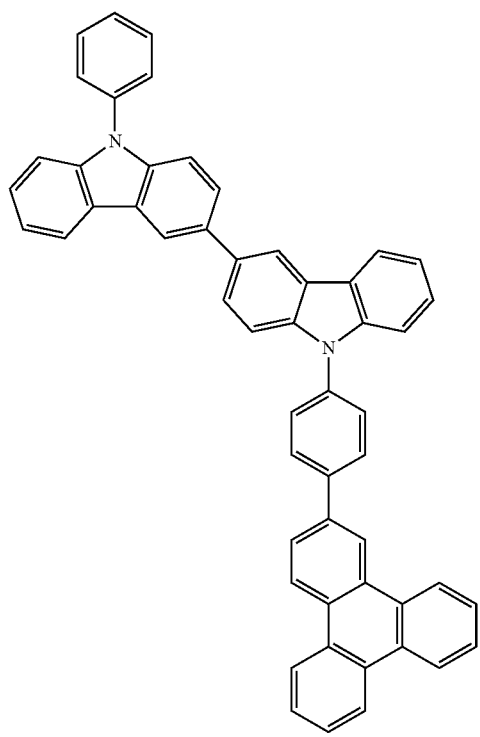
GHA-19
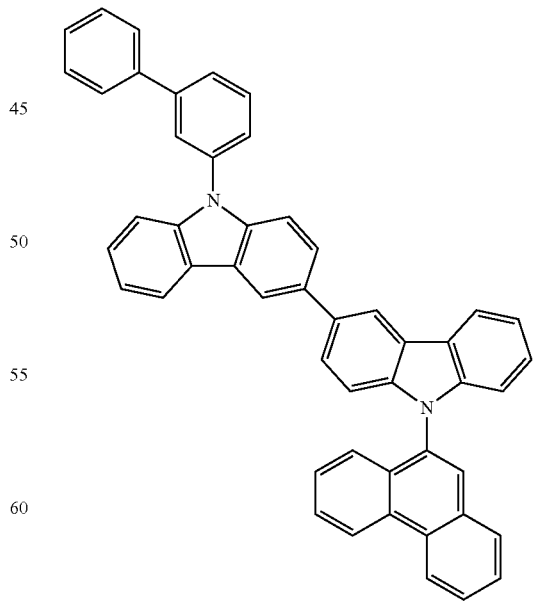

GHA-20
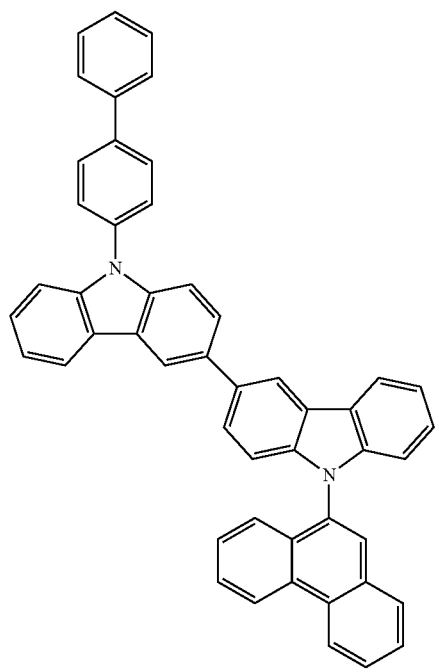
GHA-22
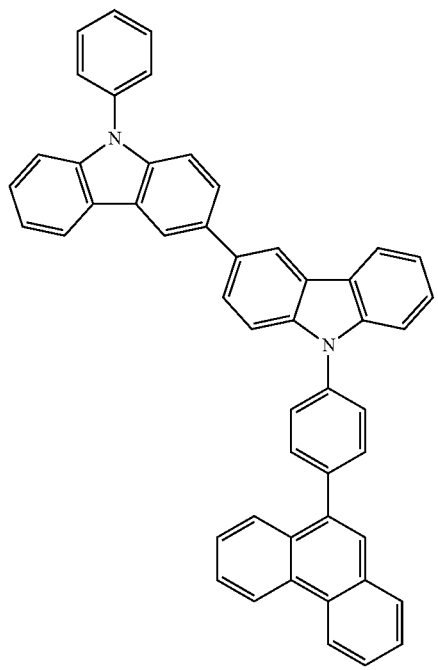
GHA-21
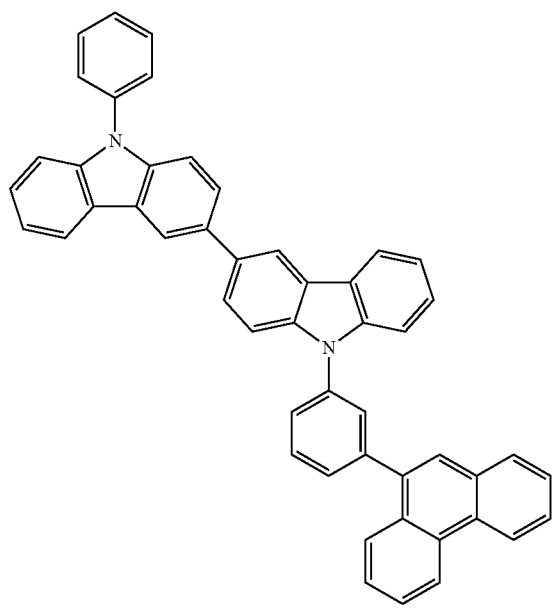
GHA-23
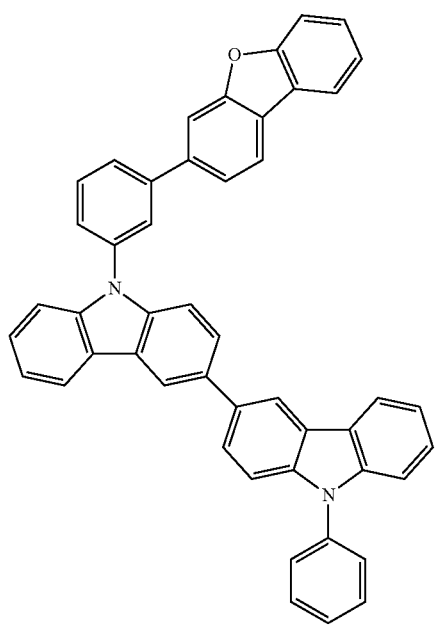

GHA-24
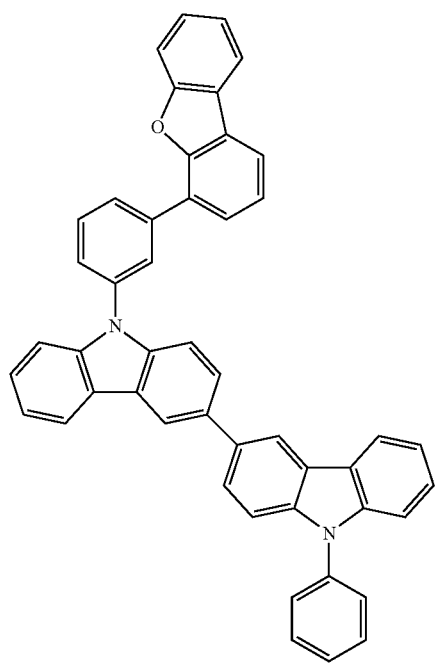
GHA-26
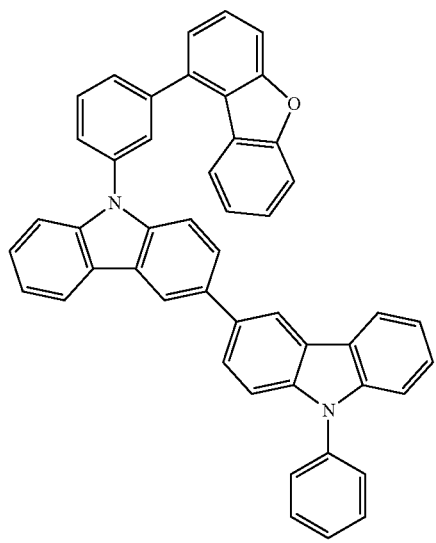
GHA-25
GHA-27
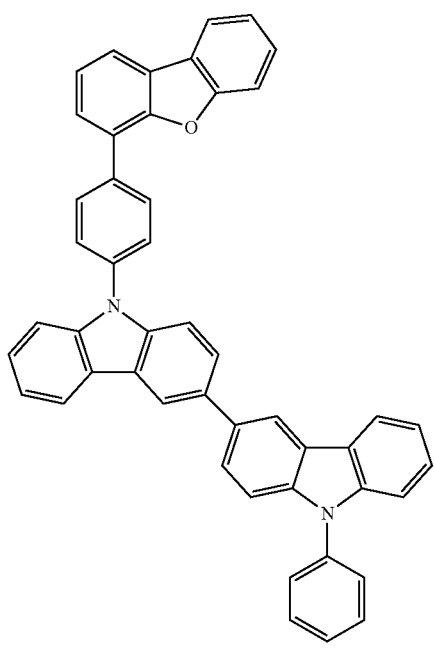

GHA-28
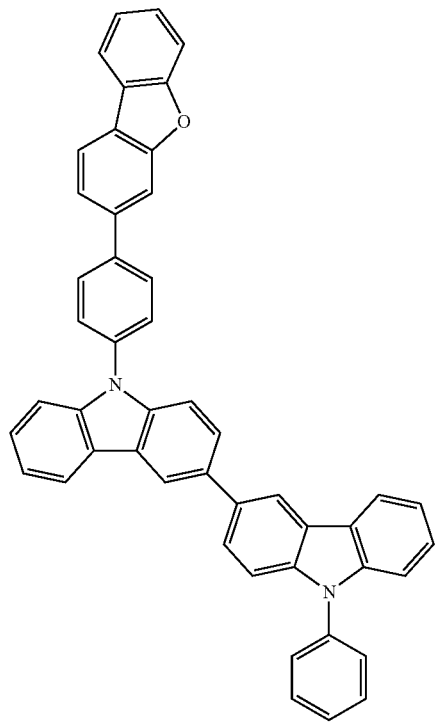
GHA-29
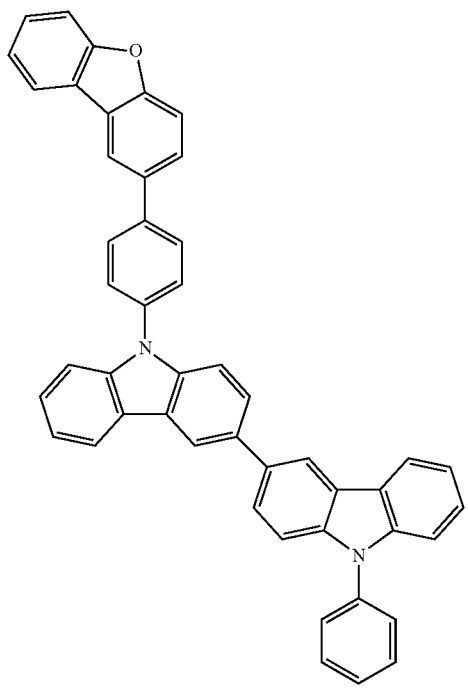
GHA-30
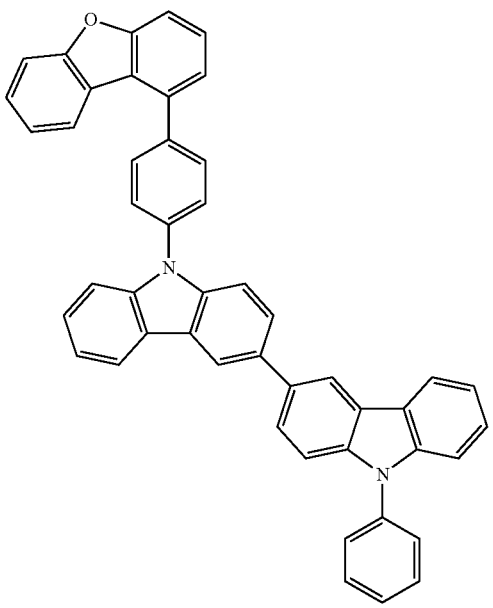
GHA-31
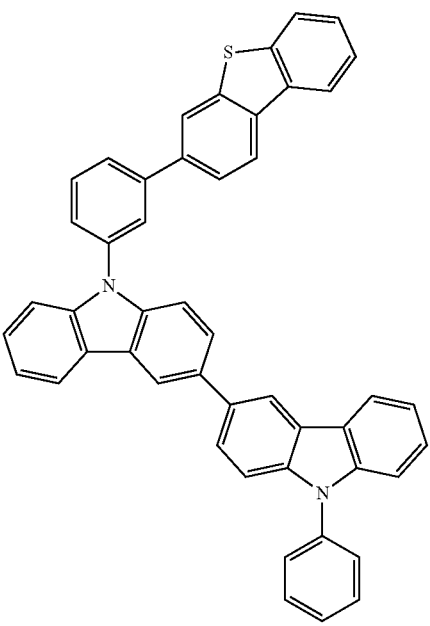

GHA-32
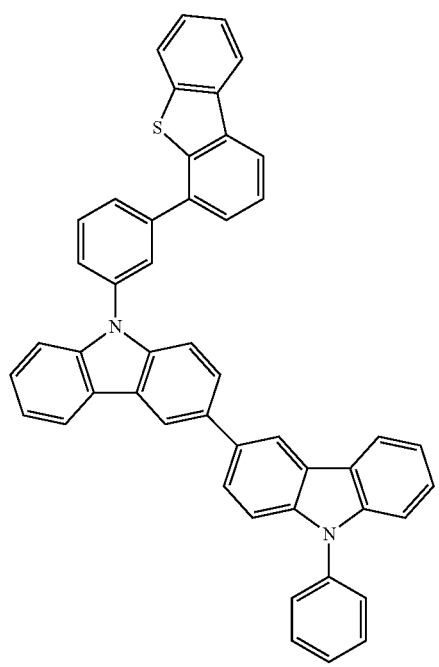
GHA-34
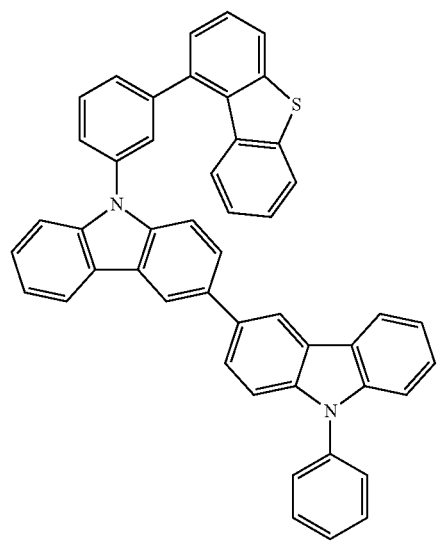
GHA-33
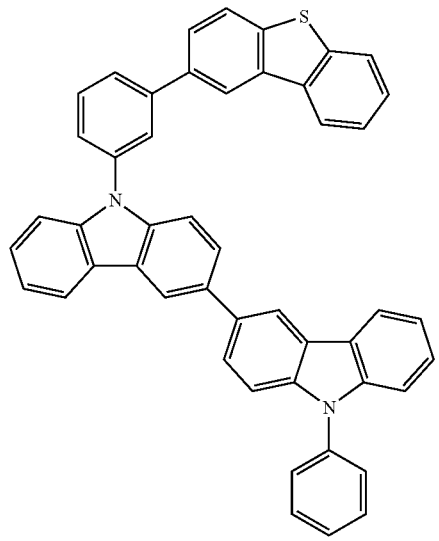
GHA-35
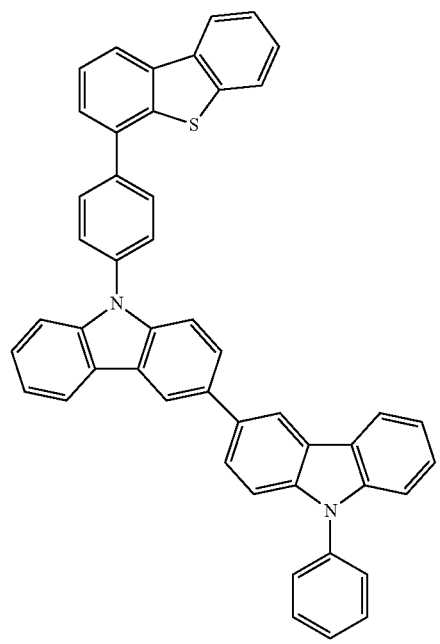

GHA-36
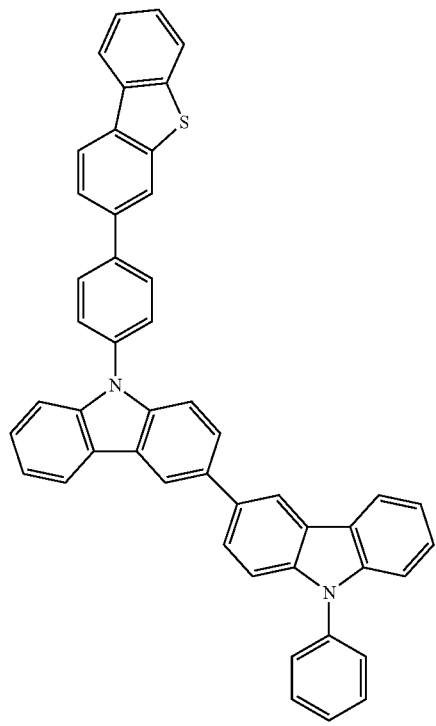
GHA-37
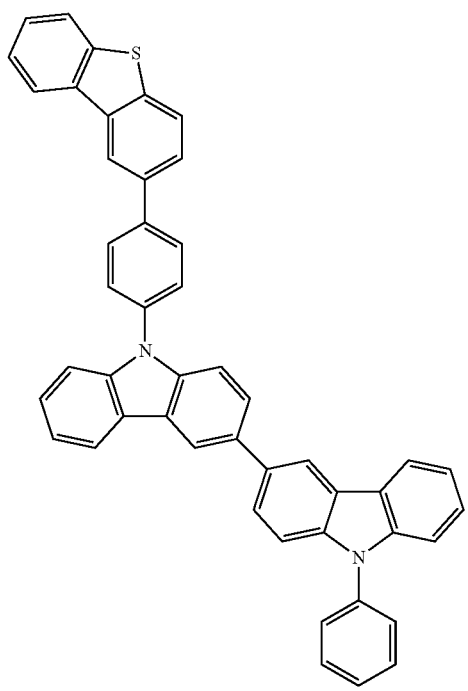
GHA-38
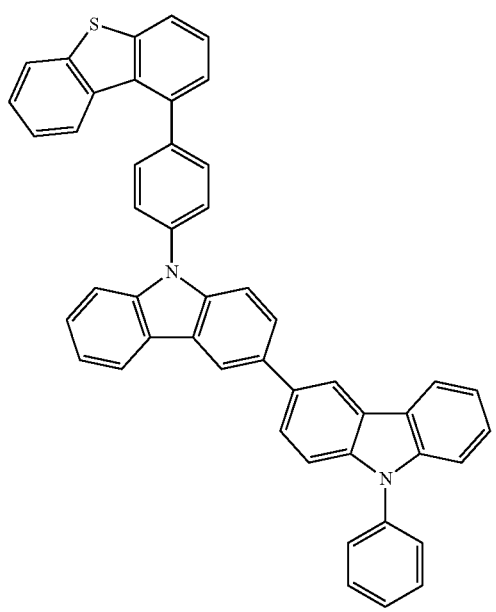
GHA-39
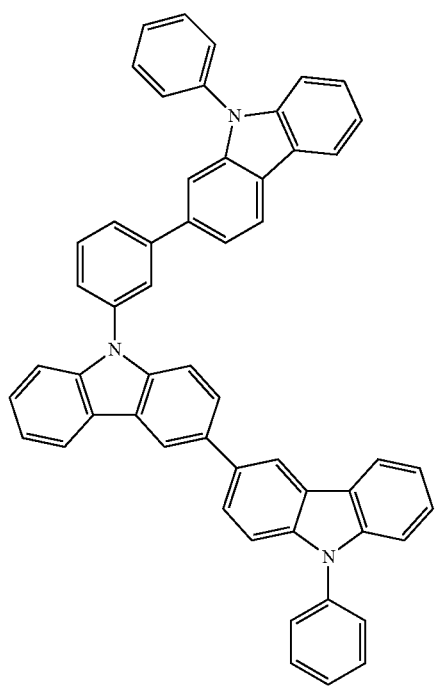

GHA-40
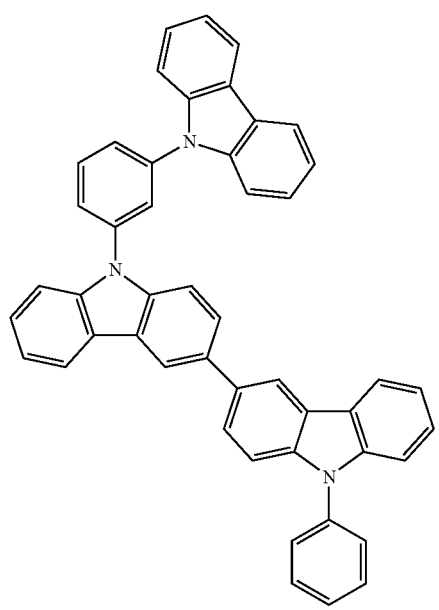
GHA-42
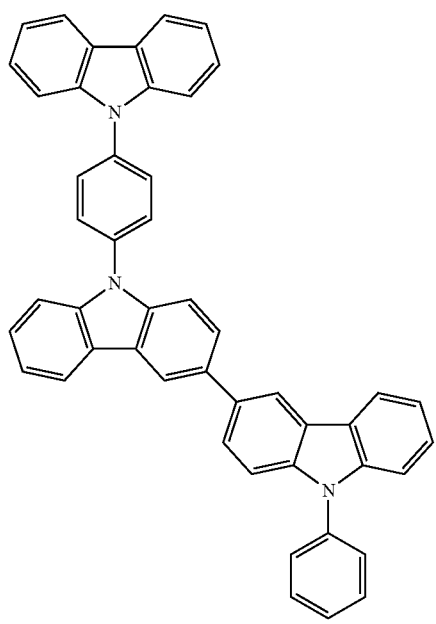
GHA-41
GHA-43
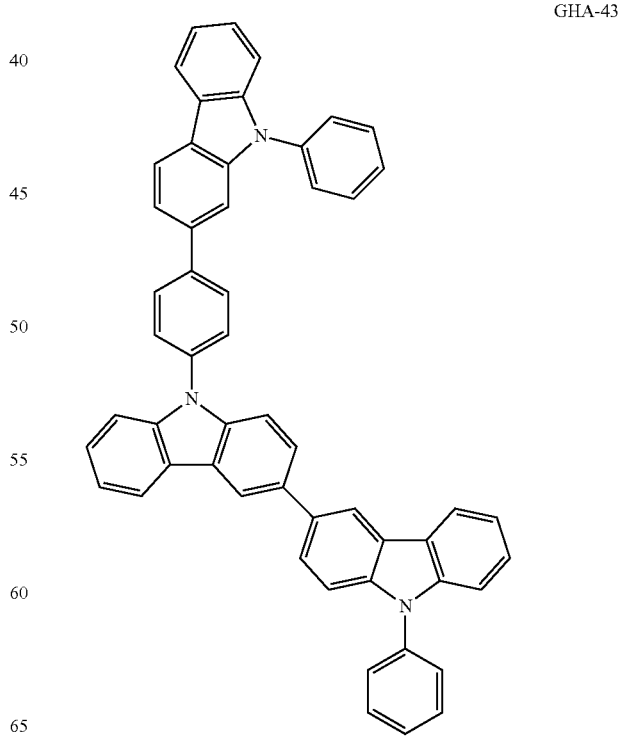

GHA-44

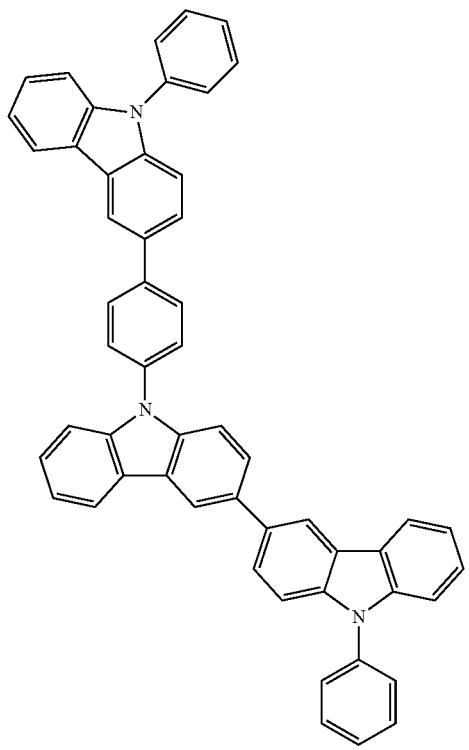

Chemical Formula 3

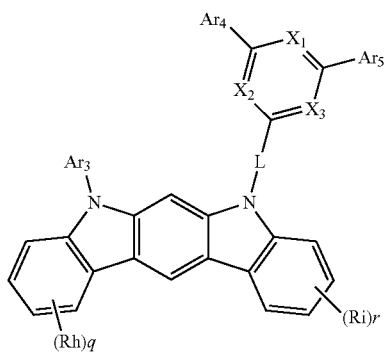

In the above Chemical Formula 3, Rh and Ri may be independently any one selected from hydrogen, heavy hydrogen, halogen, a substituted or unsubstituted $C_{1-6}$ alkyl group, a substituted or unsubstituted $C_{3-6}$ cycloalkyl group, a substituted or unsubstituted $C_{6-15}$ aryl group, a substituted or unsubstituted $C_{5-9}$ heteroaryl group, a substituted or unsubstituted carbazole group, a substituted or unsubstituted dibenzofuran group, a substituted or unsubstituted dibenzothiophene group, a substituted or unsubstituted trialkylsilyl group and a substituted or unsubstituted triarylsilyl group.

In the above Chemical Formula 3, q and r may be independently an integer from 1 to 4.

In the above Chemical Formula 3, $Ar_3$, $Ar_4$ and $Ar_5$ may be independently any one selected from a substituted or unsubstituted phenyl group, a substituted or unsubstituted biphenyl group, a substituted or unsubstituted terphenyl group, a substituted or unsubstituted naphthyl group, a substituted or unsubstituted phenanthryl group, a substituted or unsubstituted fluorenyl group, a substituted or unsubstituted triphenylenyl group, a substituted or unsubstituted dibenzofuranyl group and a substituted or unsubstituted dibenzothiophenyl group.

In the above Chemical Formula 3, L may be any one selected from a single bond, a phenyl group, a naphthyl group and a pyridyl group.

In the above Chemical Formula 3, $X_1$, $X_2$ and $X_3$ may be independently N or CH, provided that at least two of $X_1$, $X_2$ and $X_3$ are N.

For example, examples of the second green host compound may include GHB-1 to GHB-24 below. The second green host compound may comprise at least one of the below-described GHB-1 to GHB-24.

GHB-1

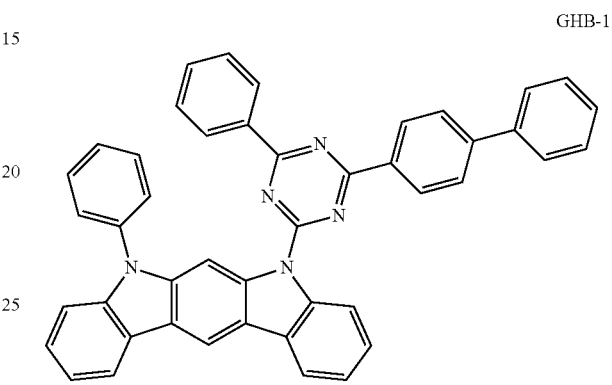

GHB-2

GHB-3

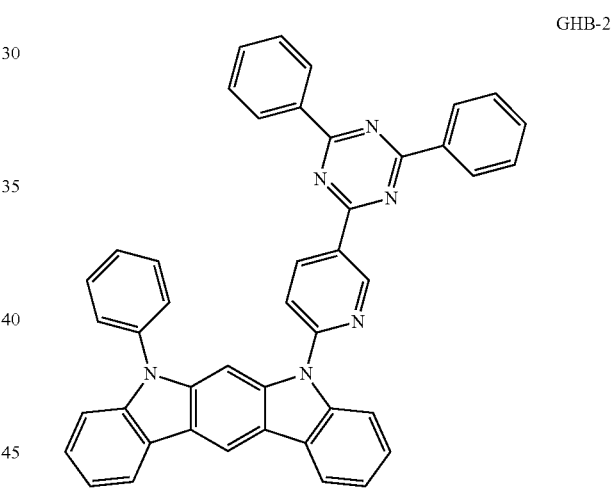

-continued
GHB-4
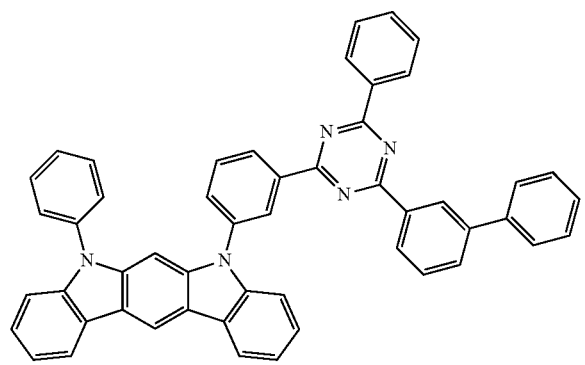
GHB-5
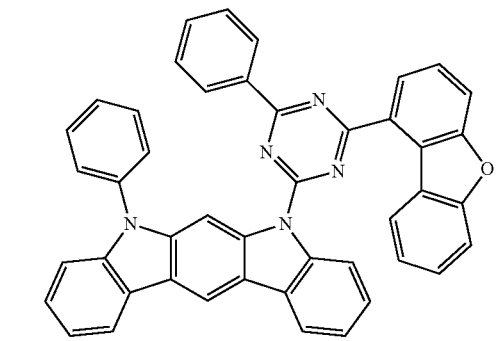
GHB-6
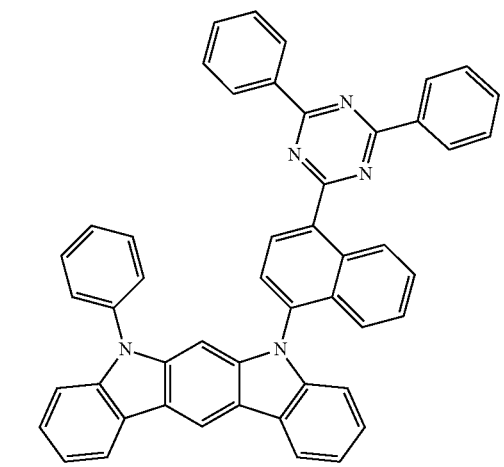
GHB-7
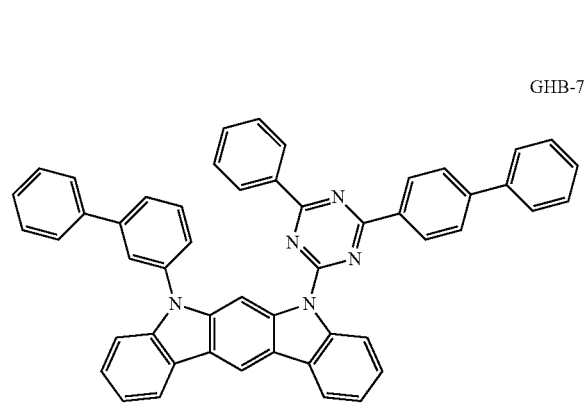
-continued
GHB-8
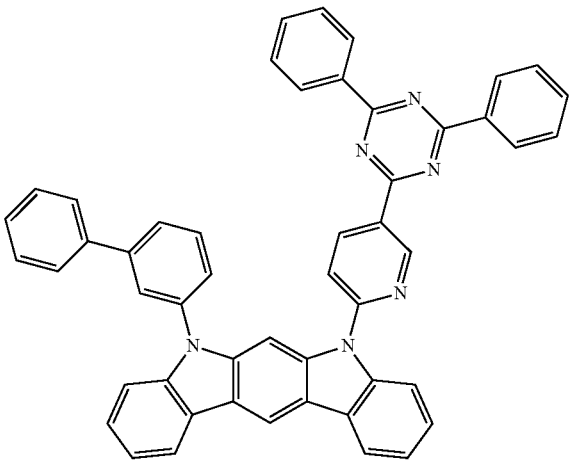
GHB-9
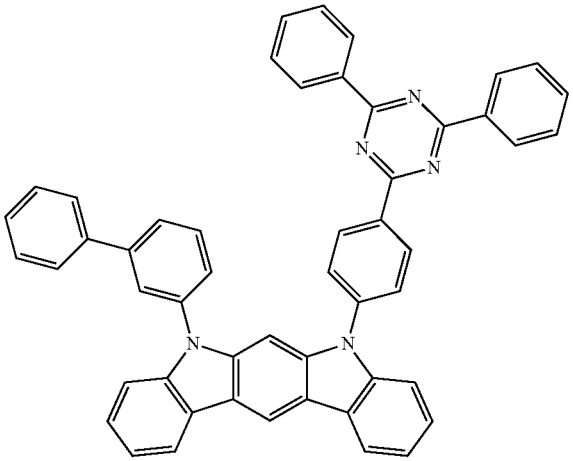
GHB-10
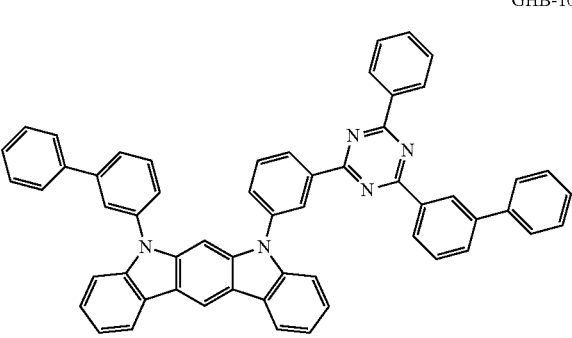
GHB-11
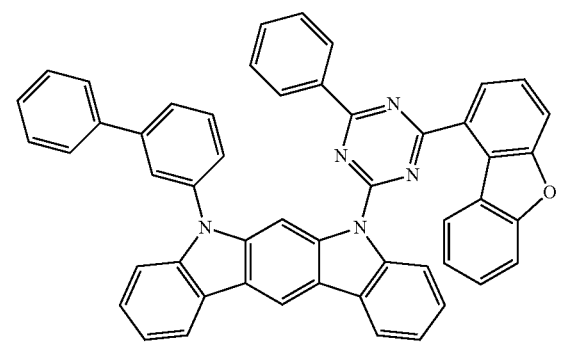

-continued
GHB-12
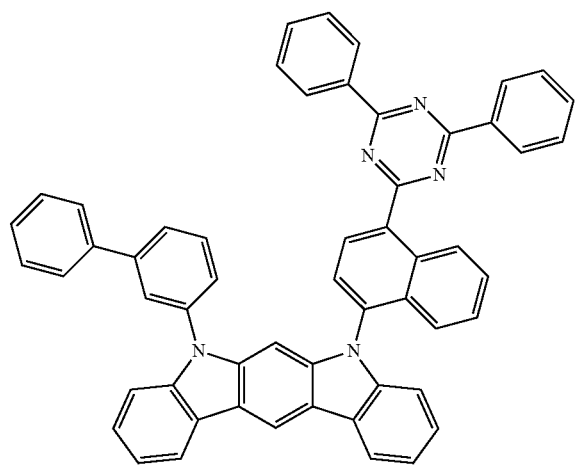
GHB-13
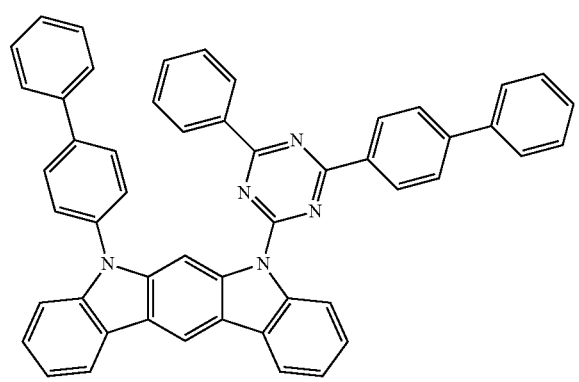
GHB-14
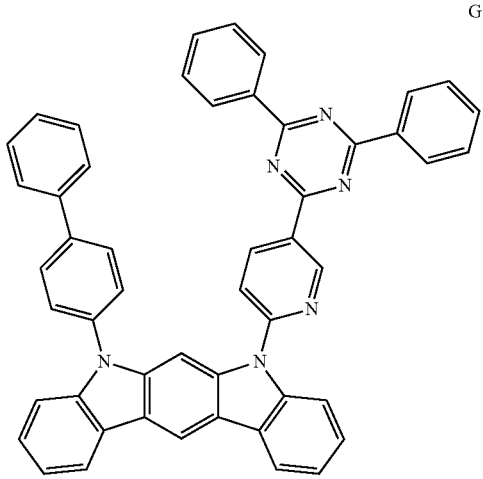
-continued
GHB-15
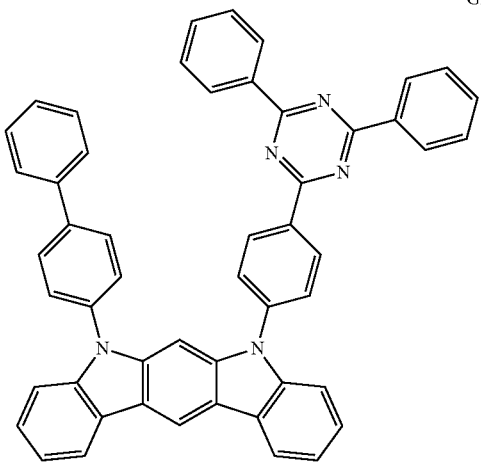
GHB-16
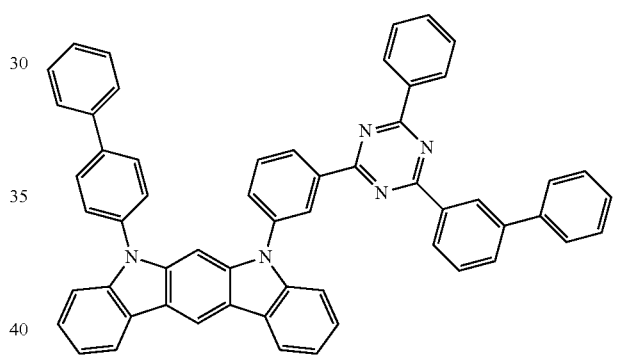
GHB-17
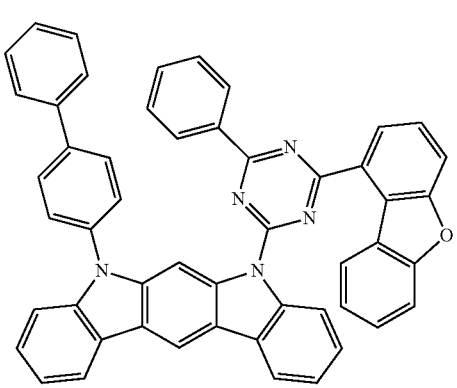

-continued

GHB-18

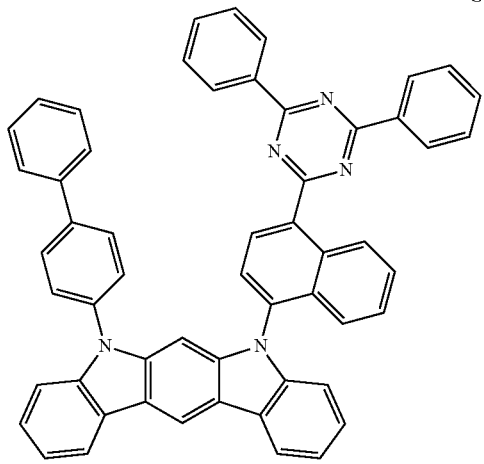

GHB-19

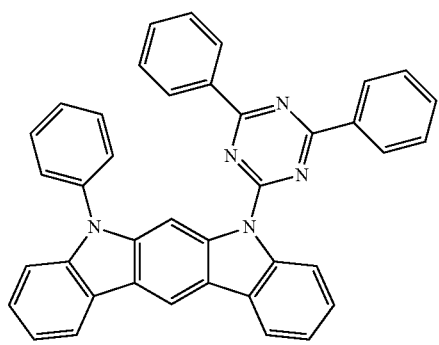

GHB-20

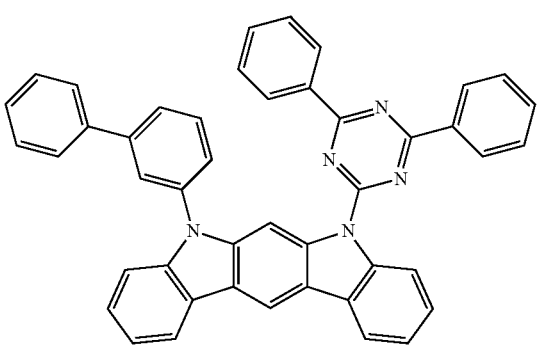

GHB-21

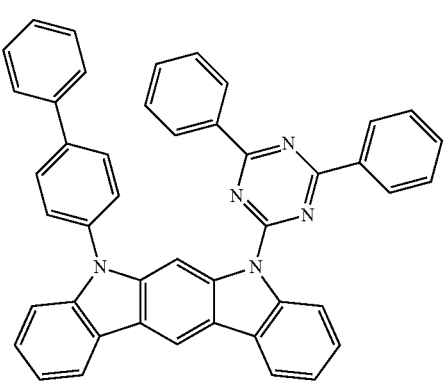

-continued

GHB-22

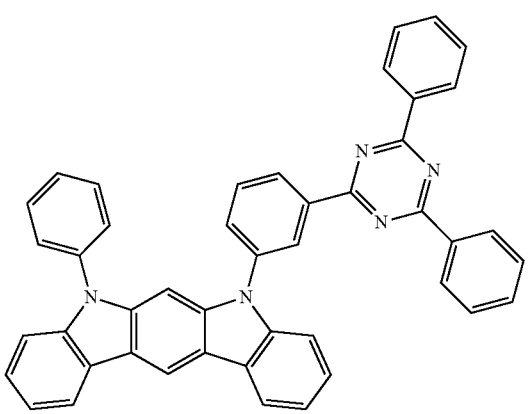

GHB-23

GHB-24

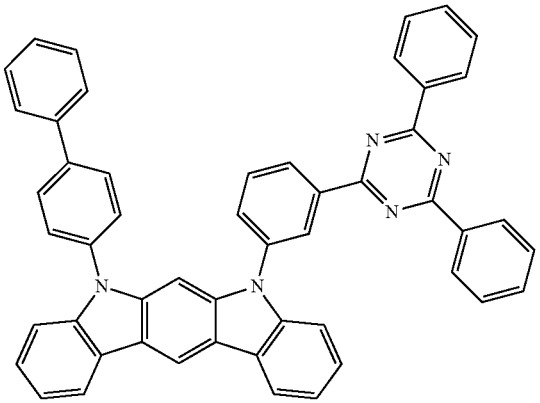

As confirmed by applicants of the present disclosure, in case the red light emitter comprises no red host compound (see comparative example 1), the green light emitter comprises no first green host compound (see comparative example 2), and the green light emitter comprises no second green host compound (see comparative example 3), charges in the red/green simultaneous light emitter may lose their balance. Accordingly, organic light emitting diode devices in the comparative examples may fail to obtain desired optimal color coordinates. Thus, the comparative examples may not acquire a white light-emitting organic light emitting diode device having high color purity and wide color gamut.

The red/green simultaneous light emitter, as described above, may comprise a structure where the red light emitter and the green light emitter are stacked. The red light emitter and the green light emitter directly contact each other. For the red/green simultaneous light emitter, a light emitting area may be distributed near an interface between the red light emitter and the green light emitter. In this case, the green light emitter may be disposed closer to the cathode than the red light emitter. In other words, the green light emitter may be disposed between the red light emitter and the cathode.

When the green light emitter is disposed closer to the cathode than the red light emitter, mobility of holes of the red host compound may be balanced with mobility of electrons of the green host compound, and the light emitting area may be distributed near the interface between the red light emitter and the green light emitter. As a result, the organic light emitting diode device may acquire an optimal color coordinate required for implementing white light.

When the green light emitter may be disposed closer to the anode than the red light emitter, in other words, the green light emitter is disposed between the red light emitter and the anode, mobility of holes and mobility of electrons, injected into the red/green simultaneous light emitter, may be unbalanced at the anode and the cathode, and a ratio of luminance of the red light emitter to luminance of the green light emitter may change. As a result, an optimal color coordinate required for emitting white light may not be easily acquired from the red/green simultaneous light emitter. That is, when the green light emitter is disposed between the red light emitter and the anode, a color, having a wave length longer than or shorter than a wave length of a desired color, may be emitted. Thus, the desired color may not be acquired.

The red phosphorescence light emitting dopant may be at least one of a compound represented by Chemical Formula 4 below, and a compound represented by Chemical Formula 5 below.

Chemical Formula 4

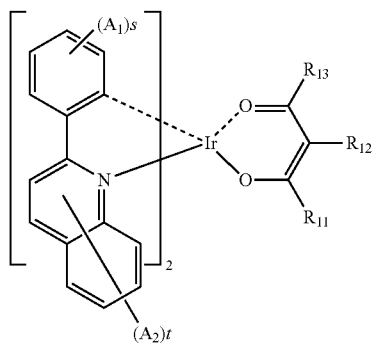

In the above Chemical Formula 4, $A_1$ and $A_2$ may be independently any one selected from hydrogen, heavy hydrogen, halogen, a substituted or unsubstituted $C_{1-6}$ alkyl group, a substituted or unsubstituted $C_{3-6}$ cycloalkyl group, a substituted or unsubstituted $C_{6-15}$ aryl group, a substituted or unsubstituted $C_{5-9}$ heteroaryl group, a substituted or unsubstituted carbazole group, a substituted or unsubstituted dibenzofuran group, a substituted or unsubstituted dibenzothiophene group, a substituted or unsubstituted trialkylsilyl group and a substituted or unsubstituted triarylsilyl group.

In the above Chemical Formula 4, s may be an integer from 1 to 4.

In the above Chemical Formula 4, t may be an integer from 1 to 6.

In the above Chemical Formula 4, $R_1$, $R_{12}$ and $R_{13}$ may be independently any one selected from hydrogen, a substituted or unsubstituted $C_{1-6}$ alkyl group, a substituted or unsubstituted $C_{3-6}$ cycloalkyl group and a substituted or unsubstituted $C_{6-10}$ aryl group, or $R_{11}$ and $R_{12}$ or $R_{12}$ and $R_{13}$ may be connected to each other to form a ring.

Chemical Formula 5

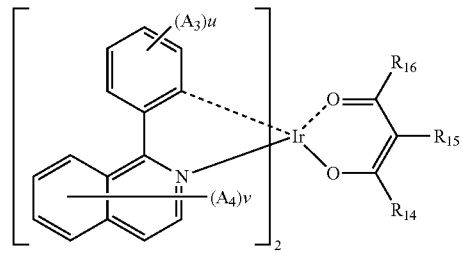

In the above Chemical Formula 5, $A_3$ and $A_4$ may be independently any one selected from hydrogen, heavy hydrogen, halogen, a substituted or unsubstituted $C_{1-6}$ alkyl group, a substituted or unsubstituted $C_{3-6}$ cycloalkyl group, a substituted or unsubstituted $C_{6-15}$ aryl group, a substituted or unsubstituted $C_{5-9}$ heteroaryl group, a substituted or unsubstituted carbazole group, a substituted or unsubstituted dibenzofuran group, a substituted or unsubstituted dibenzothiophene group, a substituted or unsubstituted trialkylsilyl group and a substituted or unsubstituted triarylsilyl group.

In the above Chemical Formula 5, u may be an integer from 1 to 4.

In the above Chemical Formula 5, v may be an integer from 1 to 6.

In the above Chemical Formula 5, $R_{14}$, $R_{15}$ and $R_{16}$ may be independently any one selected from hydrogen, a substituted or unsubstituted $C_{1-6}$ alkyl group, a substituted or unsubstituted $C_{3-6}$ cycloalkyl group and a substituted or unsubstituted $C_{6-10}$ aryl group, or $R_{14}$ and $R_{15}$ or $R_{15}$ and $R_{16}$ may be connected to each other to form a ring.

The green phosphorescence light emitting dopant may be at least one of a compound represented by Chemical Formula 6 below and a compound represented by Chemical Formula 7 below.

Chemical Formula 6

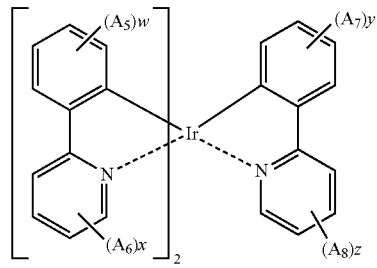

In the above Chemical Formula 6, $A_5$, $A_6$, $A_7$ and $A_8$ may be independently any one selected from hydrogen, heavy hydrogen, halogen, a substituted or unsubstituted $C_{1-6}$ alkyl group, a substituted or unsubstituted $C_{3-6}$ cycloalkyl group, a substituted or unsubstituted $C_{6-10}$ aryl group, a substituted or unsubstituted $C_{5-9}$ heteroaryl group, a substituted or unsubstituted carbazole group, a substituted or unsubstituted dibenzofuran group, a substituted or unsubstituted dibenzothiophene group, a substituted or unsubstituted trialkylsilyl group and a substituted or unsubstituted triarylsilyl group.

In the above Chemical Formula 6, w, x, y and z may be independently an integer from 1 to 4.

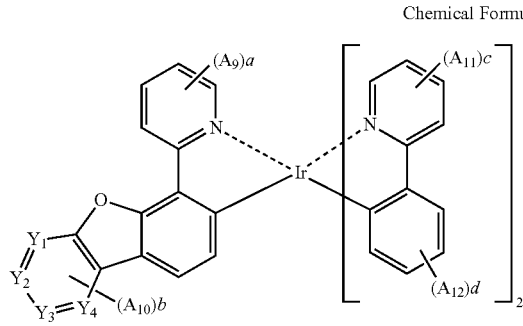

Chemical Formula 7

In the above Chemical Formula 7, $A_9$, $A_{10}$, $A_{11}$ and $A_{12}$ may be independently any one selected from hydrogen, heavy hydrogen, halogen, a substituted or unsubstituted $C_{1-6}$ alkyl group, a substituted or unsubstituted $C_{3-6}$ cycloalkyl group, a substituted or unsubstituted $C_{6-10}$ aryl group, a substituted or unsubstituted $C_{5-9}$ heteroaryl group, a substituted or unsubstituted carbazole group, a substituted or unsubstituted dibenzofuran group, a substituted or unsubstituted dibenzothiophene group, a substituted or unsubstituted trialkylsilyl group and a substituted or unsubstituted triarylsilyl group.

In the above Chemical Formula 7, a, c and d may be independently an integer from 1 to 4.

In the above Chemical Formula 7, b is an integer from 1 to 3.

In the above Chemical Formula 7, $Y_1$, $Y_2$, $Y_3$ and $Y_4$ may be independently N or CR', and R' may be any one selected from hydrogen, heavy hydrogen, halogen, a substituted or unsubstituted $C_{1-6}$ alkyl group, a substituted or unsubstituted $C_{3-6}$ cycloalkyl group, a substituted or unsubstituted $C_{6-10}$ aryl group and a substituted or unsubstituted $C_{5-9}$ heteroaryl group.

The organic light emitting diode device may be used for a display device or a lighting apparatus and the like.

When the organic light emitting diode device is used for a display device or a lighting apparatus and the like, a range of maximum emission wavelengths of the red phosphorescence light emitting dopant may be from 610 nm to 640 nm. For example, a range of maximum emission wavelengths of the red phosphorescence light emitting dopant may be from 620 nm to 630 nm.

When the organic light emitting diode device is used for a display device or a lighting apparatus and the like, a range of maximum emission wavelengths of the green phosphorescence light emitting dopant may be from 510 nm to 540 nm. For example, a range of maximum emission wavelengths of the green phosphorescence light emitting dopant may be from 525 nm to 535 nm.

The blue light emitter may comprise a blue host compound and a blue dopant compound. An example of the blue host compound may include an anthracene-based compound, and an example of the blue dopant compound may include a pyrene-based dopant compound or a boron-containing dopant compound.

One or more blue light emitters may be provided. When a single blue light emitter is provided, the blue light emitter may be disposed between the anode and the red light emitter, or between the cathode and the green light emitter. When two or more blue light emitters are provided, the red/green simultaneous light emitter may be disposed between the blue light emitters.

A charge generating layer (CGL) may be disposed between the blue light emitter and the red/green simultaneous light emitter. The charge generating layer (CGL) may comprise an n-type charge generating layer (n-CGL) and a p-type charge generating layer (p-CGL). When the charge generating layer (CGL) is disposed between the blue light emitter and the red/green simultaneous light emitter, the emission efficiency and life span of the organic light emitting diode device may be enhanced.

The organic light emitting diode device may further comprise a hole injecting layer, a hole transporting layer, an electron transporting layer, an electron injecting layer, a first functional layer performing a hole transportation function as well as a hole injection function, a second functional layer performing an electron injection function as well as an electron transportation function, an electron blocking layer, a hole blocking layer, a buffer layer and the like.

For example, when the organic light emitting diode device comprises all of the anode, the cathode, the light emitting layer, the hole injecting layer, the hole transporting layer, the electron transporting layer, the electron injecting layer, the first functional layer, the second functional layer, the electron blocking layer, the hole blocking layer and the buffer layer, disposition relationships among the layers may be described as follows, and even when some of the layers are omitted, one having ordinary skill in the art to which the present disclosure pertains may modify the disposition relationships among the layers with reference to the below-described disposition relationships of the layers.

The hole injecting layer may be disposed between the anode and the hole transporting layer. The hole transporting layer may be disposed between the hole injecting layer and the first functional layer. The first functional layer may be disposed between the hole transporting layer and the buffer layer. The buffer layer may be disposed between the first functional layer and the electron blocking layer. The electron blocking layer may be disposed between the buffer layer and the light emitting layer. The light emitting layer may be disposed between the electron blocking layer and the hole blocking layer. The hole blocking layer may be disposed between the light emitting layer and the electron transporting layer. The electron transporting layer may be disposed between the hole blocking layer and the electron injecting layer. The electron injecting layer may be disposed between the electron transporting layer and the second functional layer. The second functional layer may be disposed between the electron injecting layer and the cathode.

The organic light emitting diode device may satisfy at least one of below-described (i), (ii) and (iii) to ensure improvement in color purity and color gamut of the organic light emitting diode device and in driving properties or driving efficiency and the like.

(i) A mixing ratio of the first green host compound to the second green host compound may be 3:7 to 7:3. For example, a mixing ratio of the first green host compound to the second green host compound may be 5:5.

(ii) An ionization potential value of the red host compound may be −5.1 eV to −5.7 eV. An ionization potential value of the first green host compound may be −5.1 eV to −5.7 eV, and an electron affinity value of the second green host compound may be −2.5 eV to −3.1 eV.

(iii) A thickness of the red light emitter may be 5 nm to 30 nm, and a thickness of the green light emitting layer may be 5 nm to 40 nm. For example, a thickness of the red light emitting layer may be 10 nm to 20 nm, and a thickness of the green light emitting layer may be 20 nm to 40 nm. The green light emitter may be thicker than the red light emitter.

Regarding (i), the green light emitter may comprise a mixture of the first green host compound and the second green host compound. A composition ratio of the first green host compound and the second green host compound is an important factor for determining a color coordinate of the red/green simultaneous light emitter.

The color coordinate of the red/green simultaneous light emitter, as described above, may be determined by a balance between charges of a hole and an electron. The first green host compound may be a hole-transporting host compound, and the second green host compound may be an electron-transporting host compound. When content of the hole-transporting host compound becomes larger, an exciton formation area may be formed at a side from the interface between the red light emitter and the green light emitter disproportionately towards the green light emitter, a color coordinate of the red/green simultaneous light emitter becomes greener (a color coordinate x a coordinate value becomes lower). When content of the electron-transporting host compound becomes larger, an exciton formation area may be formed at a side from the interface between the red light emitter and the green light emitter disproportionately towards the red light emitter, a color coordinate of the red/green simultaneous light emitter becomes redder (a color coordinate x a coordinate value becomes lower).

The composition ratio of the first green host compound and the second green host compound was adjusted considering charge mobilities of the two host materials. In case any one of the two host materials has charge mobility much lower than that of the other host material in an ordinary manufacturing process where an organic light emitting diode device is acquired through vacuum evaporation of an organic material, excessively high content of the host material having a significant low charge mobility is required. In this case, there is a big difference in consumption of the two host materials. Accordingly, an operation ratio of a deposition apparatus is lowered due to a refill of a consumed host material. In the first green host compound and the second green host compound, there is no big difference between charge mobilities of the two host materials. Thus, an operation ratio of a deposition apparatus is not lowered even when the composition ratio is 3:7 to 7:3.

For a charge balance and a color balance in the red/green simultaneous light emitter, a mix ratio of the first green host compound to the second green host compound may be 3:7 to 7:3. Preferably, a composition ratio of the first green host compound to the second green host compound may be 5:5.

Regarding (ii), an amount and a speed of charges (holes and electrons) injected into the light emitting layer may also be determined by an energy barrier determined on an interface of each organic thin film.

The energy barrier may be created on an interface between the hole transporting layer and the red host compound, on an interface between the red host compound and the first green host compound, on an interface between the first green host compound and the second green host compound, and on an interface between the second green host compound and the electron transporting layer.

In this case, a difference between ionization potential values of the hole transporting layer and the red host compound, a difference between ionization potential values of the red host compound and the first green host compound, and a difference between electron affinity values of the second green host compound and the electron transporting layer may correspond to each energy barrier.

According to the present disclosure, when the energy barrier is controlled within 0.3 eV, an amount and a speed of charges (holes and electrons) injected into the light emitting layer may be improved. Accordingly, the organic light emitting diode device may be driven without a huge increase in a driving voltage.

In order for the energy barrier to be controlled within 0.3 eV, an ionization potential value of the red host compound and the first green host compound may be respectively −5.1 eV to −5.7 eV when an ionization potential value of the hole transporting layer is −5.4 eV or so. Additionally, in order for the energy barrier to be controlled within 0.3 eV, an electron affinity value of the second green host compound may be −2.5 eV to −3.1 eV when electron affinity of the electron transporting layer is −2.8 eV or so.

Regarding (iii), charge mobility of each host material depends on a thickness of a thin film made of the host material. When the red light emitter becomes thicker, charge mobility in the red light emitter may become lower. When the green light emitter becomes thicker, charge mobility in the green light emitter may become lower.

Considering charge mobility of the red host compound, the red light emitter may have a thickness of 5 nm to 30 nm, and preferably, may have a thickness of 10 nm to 20 nm for a balance of charge mobility in the red/green simultaneous light emitter.

In case a thickness of the red light emitter is out of the above-described range, light emission efficiency of the organic light emitting diode device may be deteriorated, and a desire color coordinate may not be easily acquired.

Specifically, in case the red light emitter has a thickness less than 5 nm, charges may pass through the red light emitter due to the tunneling effect. In this case, light emission efficiency of the organic light emitting diode device may be degraded.

In case the red light emitter has a thickness greater than 30 nm, light having a color close to red may be mainly emitted, and a desired color coordinate of white light may not be easily acquired.

To acquire desired light emission efficiency of the organic light emitting diode device and a desired color coordinate of white light, the red light emitter may preferably have a thickness of 10 nm to 20 nm.

Considering the charge mobility of each of the first green host compound and the second green host compound, the green light emitter may have a thickness of 5 nm to 40 nm, and preferably, may have a thickness of 20 nm to 40 nm for a balance of the charge mobility in the red/green simultaneous light emitter.

In case a thickness of the green light emitter is out of the above-described range, light emission efficiency of the organic light emitting diode device may be deteriorated and a desired color coordinate may not be easily acquired.

Specifically, in case the green light emitter has a thickness less than 5 nm, charges may pass through the green light emitter due to the tunneling effect. In this case, light emission efficiency of the organic light emitting diode device may be degraded.

In case the green light emitter has a thickness greater than 40 nm, light having a color close to green may be mainly emitted, and a desire color coordinate of white light may not be easily acquired.

To acquire desired light emission efficiency of the organic light emitting diode device and a desired color coordinate of white light, the green light emitter may preferably have a thickness of 20 nm to 40 nm.

The thicknesses of the red light emitter and the green light emitter may be controlled within the above-described range of thicknesses for a charge balance or a color balance in the red/green simultaneous light emitter.

A light emitting spectrum in FIGS. 1 to 9 and a color coordinate in table 2 were acquired using organic light emitting diode devices in comparative examples and organic light emitting diode devices in embodiments.

Embodiment 1

A hole injecting layer, a hole transporting layer, a light emitting layer, an electron transporting layer, an electron injecting layer and a cathode were deposited on an ITO substrate by evaporation in a below-described order of (a) to (e) under a vacuum of about $5 \times 10^{-6}$ to $7 \times 10^{-6}$ torr, and then an organic light emitting diode device (ITO/HIL/HTL/EML/ETL/EIL/cathode), acquired to form a coating film, was moved from a deposition chamber to a drying box and then was encapsulated using a UV hardening epoxy and a moisture getter.

Before being used, the ITO substrate was washed with UV ozone and was placed in an evaporation system, and then was moved into a vacuum deposition chamber such that the hole injecting layer, the hole transporting layer, the light emitting layer, the electron transporting layer, the electron injecting layer and the cathode were deposited on the ITO substrate in the below-described order of (a) to (e).

(a) A hole injecting layer (thickness of 50 Å): A compound represented by Formula (I) below was used as a material for the hole injecting layer.

Formula (I)

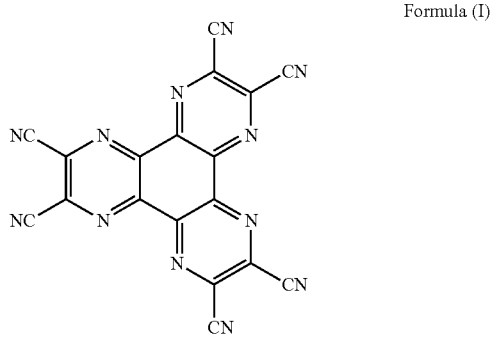 [SMILES: N#Cc1nc2c3nc(C#N)c(C#N)nc3c3nc(C#N)c(C#N)nc3c2nc1C#N]

(b) A hole transporting layer (thickness of 200 Å): A compound represented by Formula (II) below was used as a material for the hole transporting layer.

Formula (II)

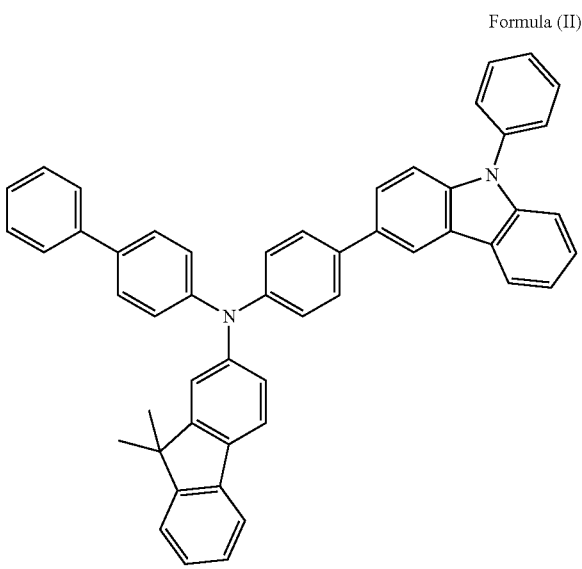 [SMILES: CC1(C)c2ccccc2-c2ccc(N(c3ccc(-c4ccccc4)cc3)c3ccc(-c4ccc5c(c4)c4ccccc4n5-c4ccccc4)cc3)cc21]

(c) A light emitting layer: A red light emitter (thickness of 200 Å) and a green light emitter (thickness of 300 Å) were deposited on the hole transporting layer in an order of the red light emitter and the green light emitter. RH-4 was used as a host of the red light emitter, and 3% of dopant was doped. A mixture, where GHA-2 and GHB-1 were mixed at a ratio of 5:5, was used as a host of the green light emitter, and 15% of dopant was doped.

RH-4

-continued

GHA-2

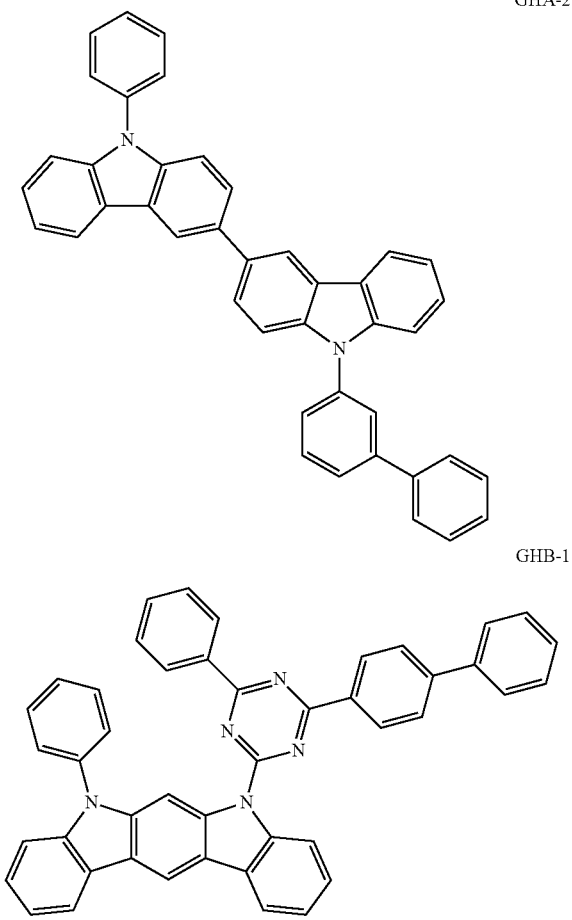

GHB-1

(f) An electron transporting layer (thickness of 200 Å): A compound represented by Formula (III) below was used as a material for the electron transporting layer.

Formula (III)

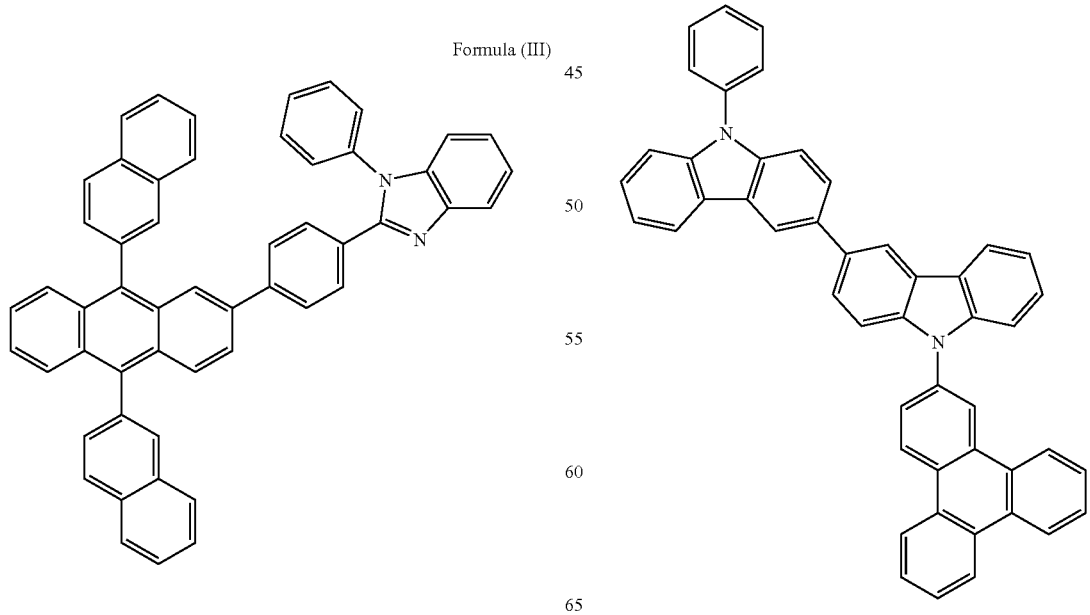

(g) An electron injecting layer (thickness of 10 Å): LiF was used as a material for the electron injecting layer.

(h) A cathode (thickness of 1000 Å): Al was used as the cathode.

Embodiment 2

An organic light emitting diode device of embodiment 2 was manufactured using the same method as embodiment 1 except that RH-10 was used instead of RH-4 used in embodiment 1.

RH-10

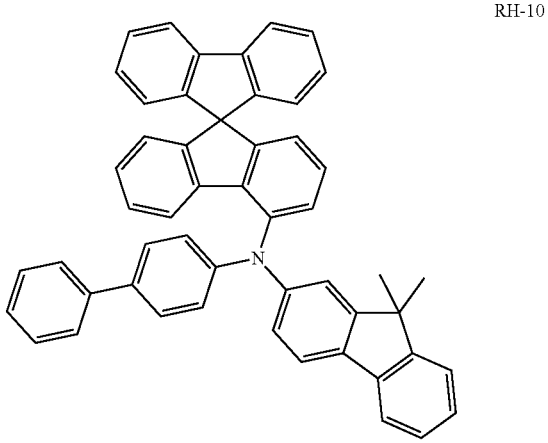 [SMILES: CC1(C)c2ccccc2-c2ccc(N(c3ccc(-c4ccccc4)cc3)c3cccc4c3-c3ccccc3C43c4ccccc4-c4ccccc43)cc21]

Embodiment 3

An organic light emitting diode device of embodiment 3 was manufactured using the same method as embodiment 1 except that GHA-13 was used instead of GHA-2 used in embodiment 1.

GHA-13

Embodiment 4

An organic light emitting diode device of embodiment 4 was manufactured using the same method as embodiment 1 except that GHB-2 was used instead of GHB-1 used in embodiment 1.

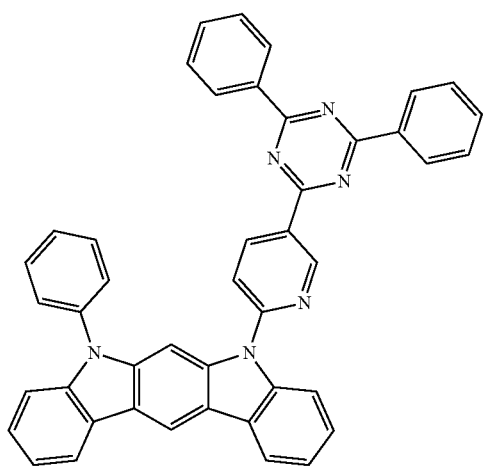

GHB-2

Embodiment 5

An organic light emitting diode device of embodiment 5 was manufactured using the same method as embodiment 1 except that GHA-5 and GHB-3 were used instead of GHA-2 and GHB-1 used in embodiment 1.

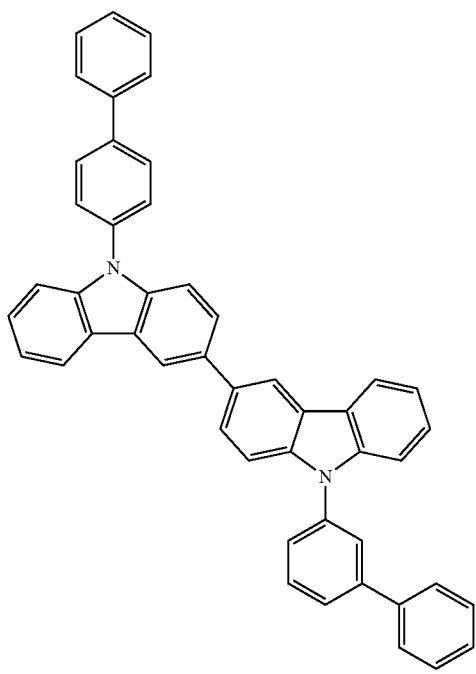

GHA-5

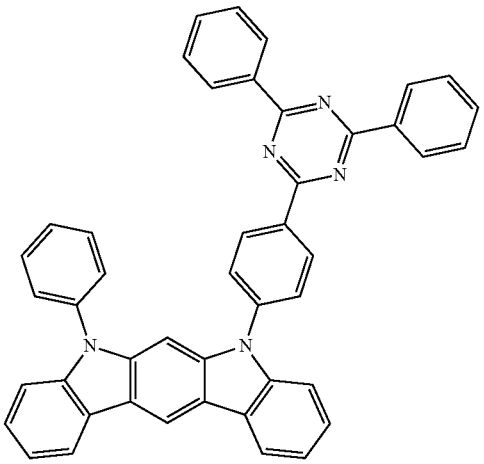

GHB-3

Embodiment 6

An organic light emitting diode device of embodiment 6 was manufactured using the same method as embodiment 1 except that GHA-4 and GHB-3 were used instead of GHA-2 and GHB-1 used in embodiment 1 and that a composition ratio of GHA-4 and GHB-3 was 3:7.

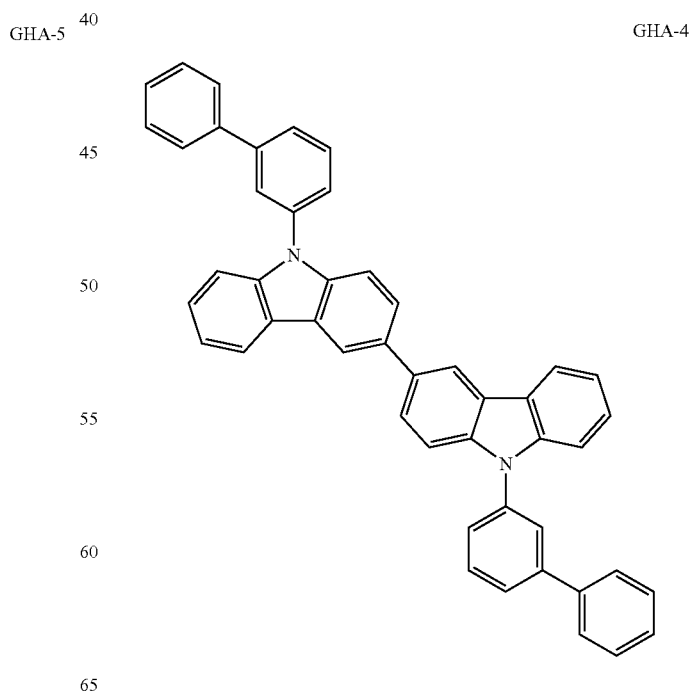

GHA-4

GHB-3

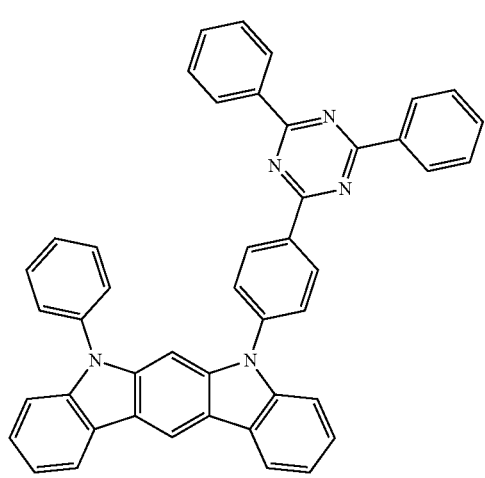

Compound B

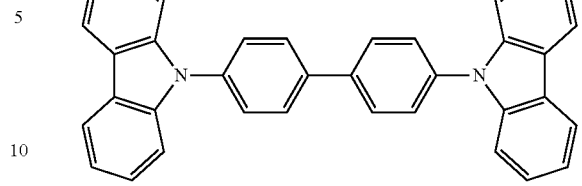

Comparative Example 3

An organic light emitting diode device of comparative example 3 was manufactured using the same method as embodiment 1 except that compound C was used instead of GHB-1 used in embodiment 1.

Compound C

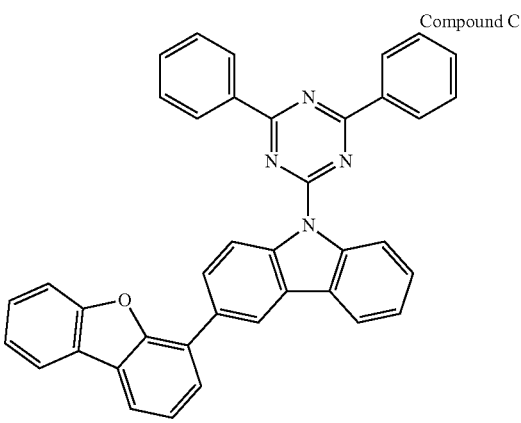 [SMILES: c1ccc(-c2nc(-c3ccccc3)nc(-n3c4ccccc4c4cc(-c5cccc6c5oc5ccccc56)ccc43)n2)cc1]

Embodiment 7

An organic light emitting diode device of embodiment 7 was manufactured using the same method as embodiment 1 except that GHA-4 and GHB-3 were used instead of GHA-2 and GHB-1 used in embodiment 1 and that a composition ratio of GHA-4 and GHB-3 was 5:5.

Embodiment 8

An organic light emitting diode device of embodiment 8 was manufactured using the same method as embodiment 1 except that GHA-4 and GHB-3 were used instead of GHA-2 and GHB-1 used in embodiment 1 and that a composition ratio of GHA-4 and GHB-3 was 7:3.

Comparative Example 1

An organic light emitting diode device of comparative example 1 was manufactured using the same method as embodiment 1 except that compound A was used instead of RH-4 used in embodiment 1.

Compound A

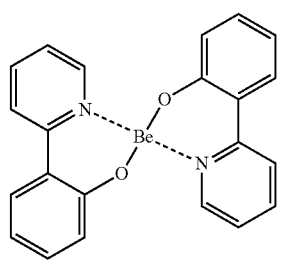

Comparative Example 2

An organic light emitting diode device of comparative example 2 was manufactured using the same method as embodiment 1 except that compound B was used instead of GHA-2 used in embodiment 1.

Figure 2:
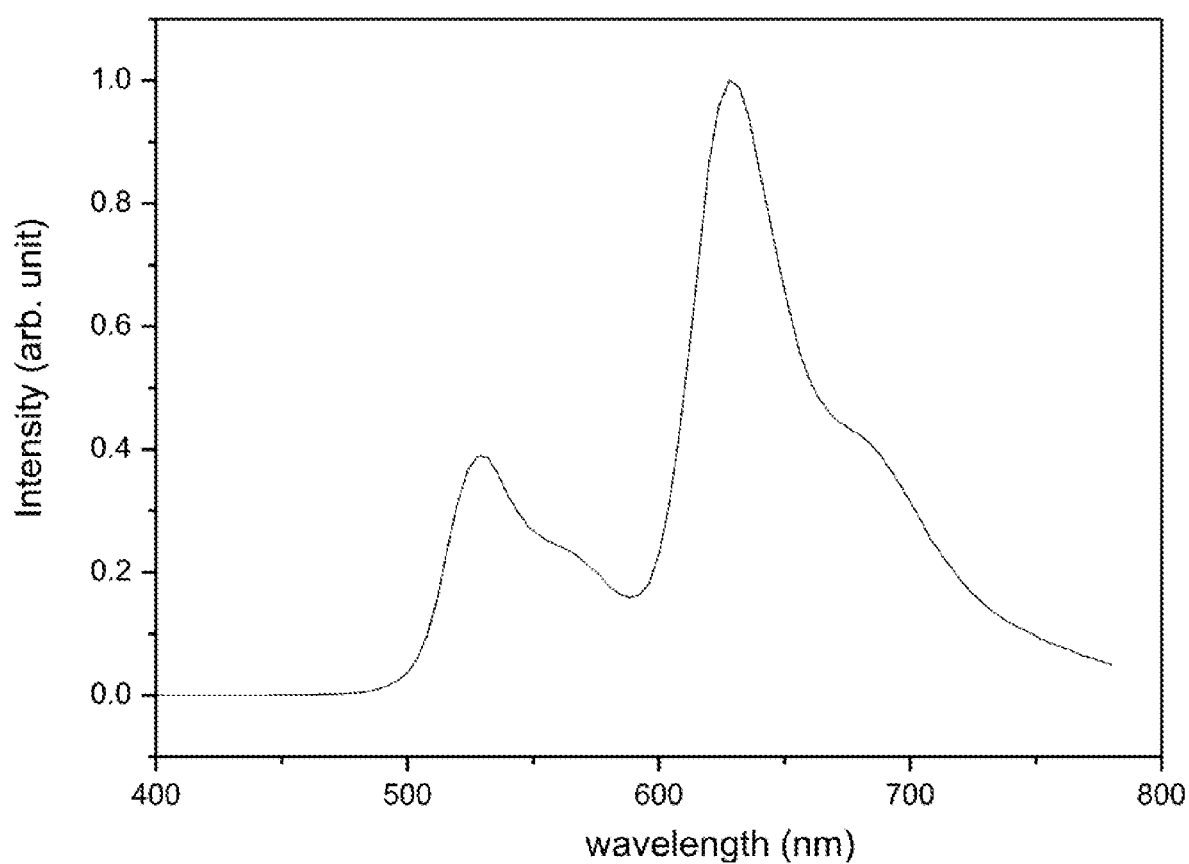
FIG. 2 shows an image of a light emitting spectrum of an organic light emitting diode device on the basis of Comparative Example 2.
Figure 3:
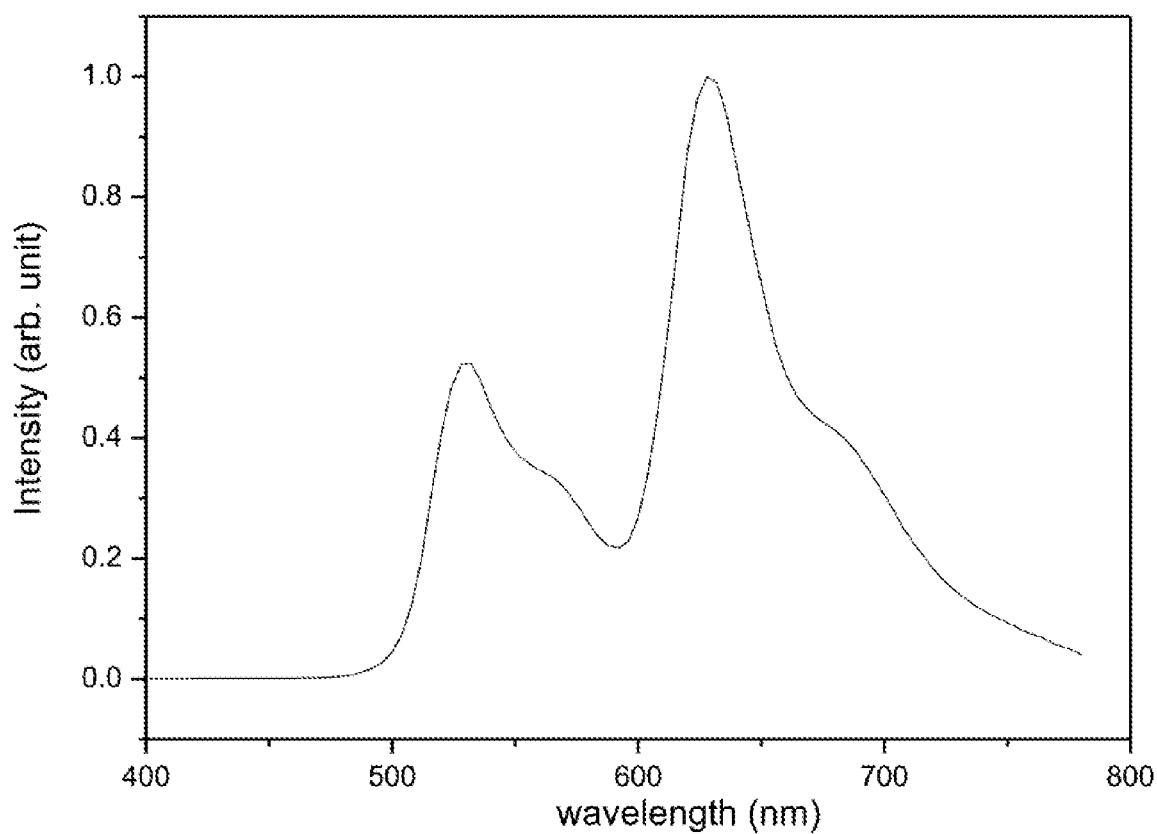
FIG. 3 shows an image of a light emitting spectrum of an organic light emitting diode device on the basis of Comparative Example 3.
Figure 4:
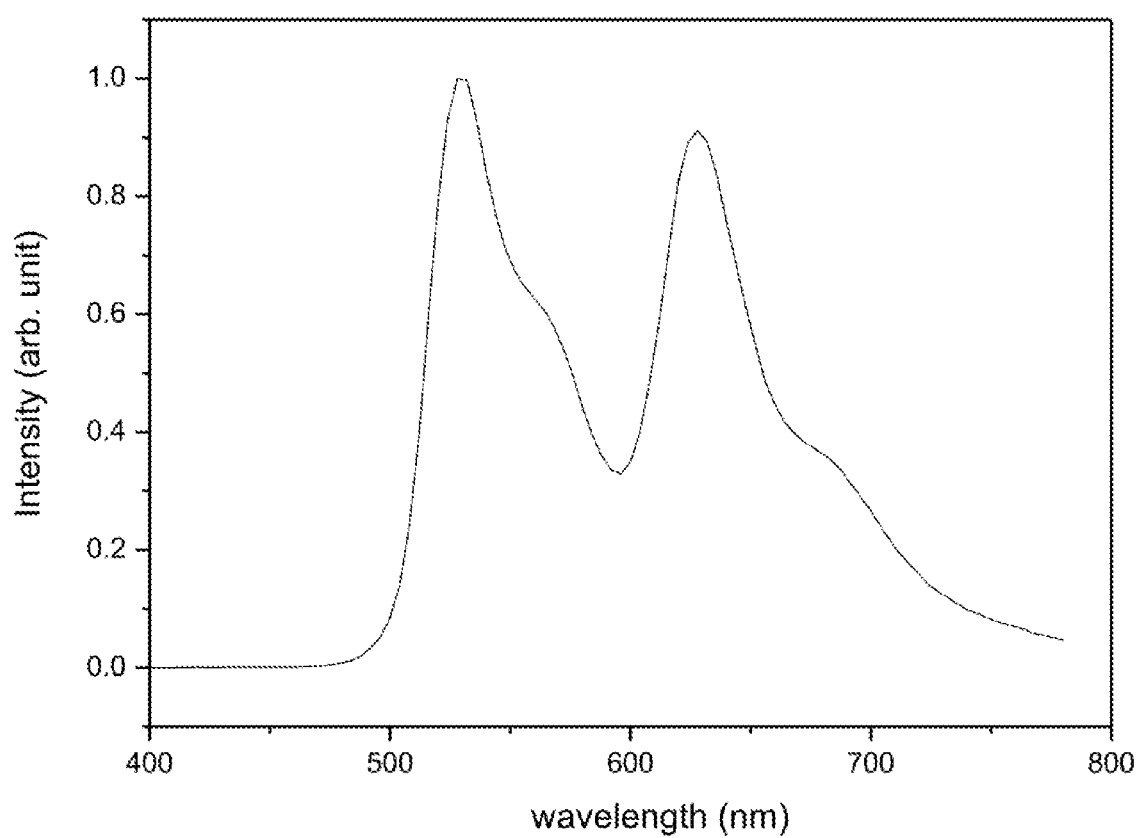
FIG. 4 shows an image of a light emitting spectrum of an organic light emitting diode device on the basis of Embodiment 1.
Figure 5:
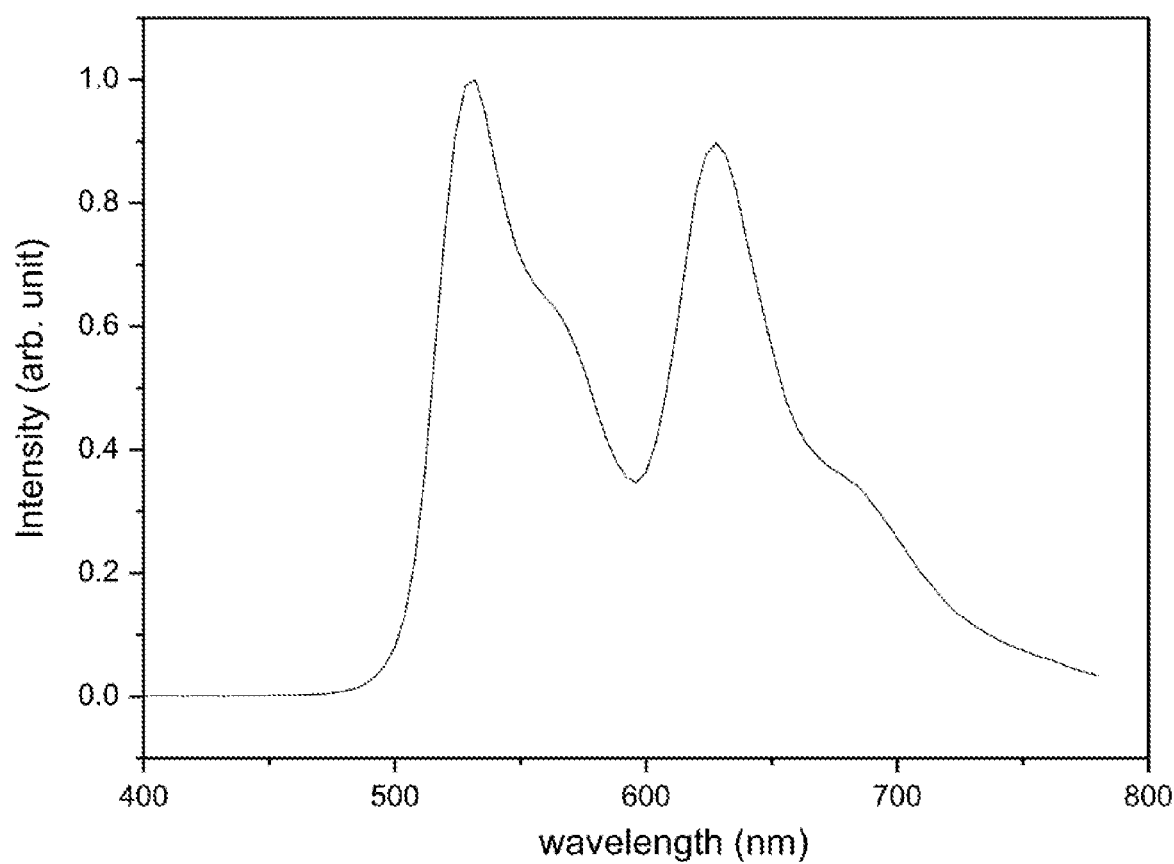
FIG. 5 shows an image of a light emitting spectrum of an organic light emitting diode device on the basis of Embodiment 2.
Figure 6:
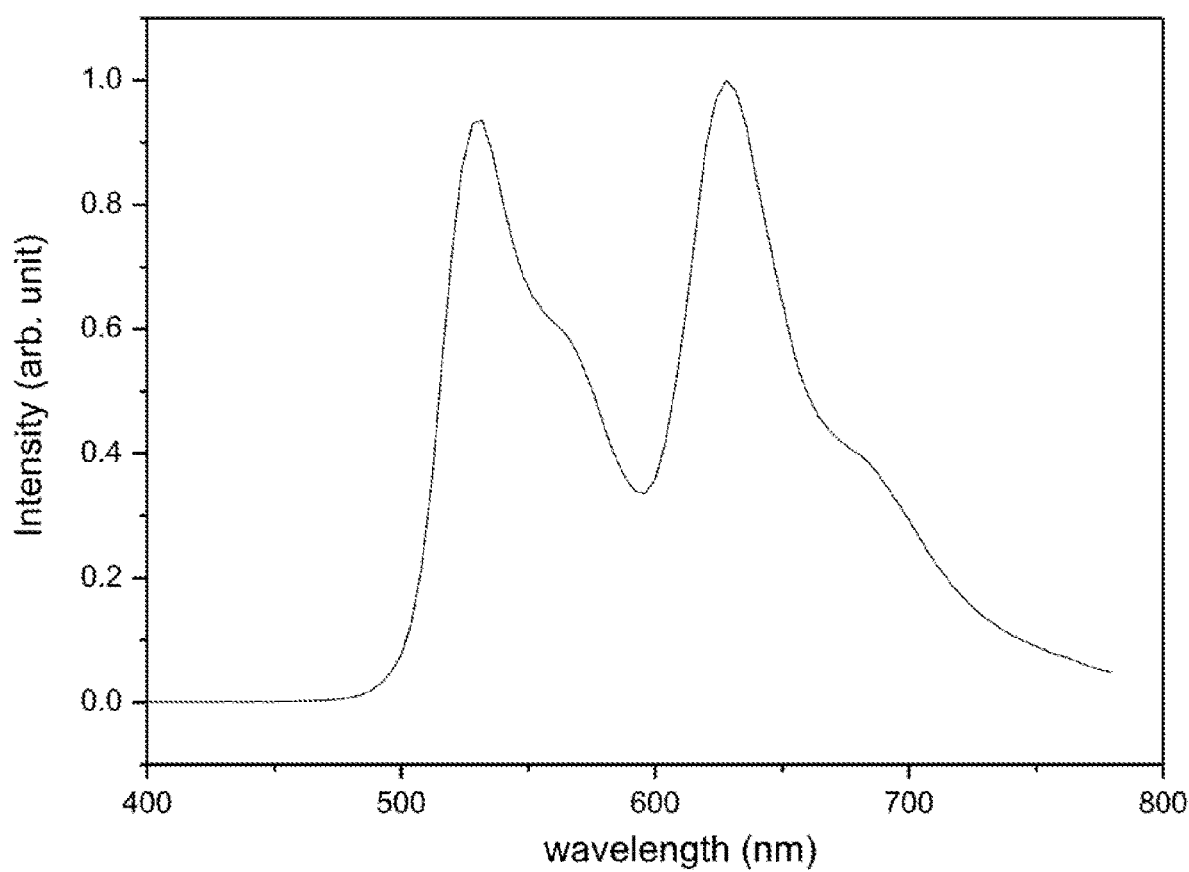
FIG. 6 shows an image of a light emitting spectrum of an organic light emitting diode device on the basis of Embodiment 3.
Figure 7:
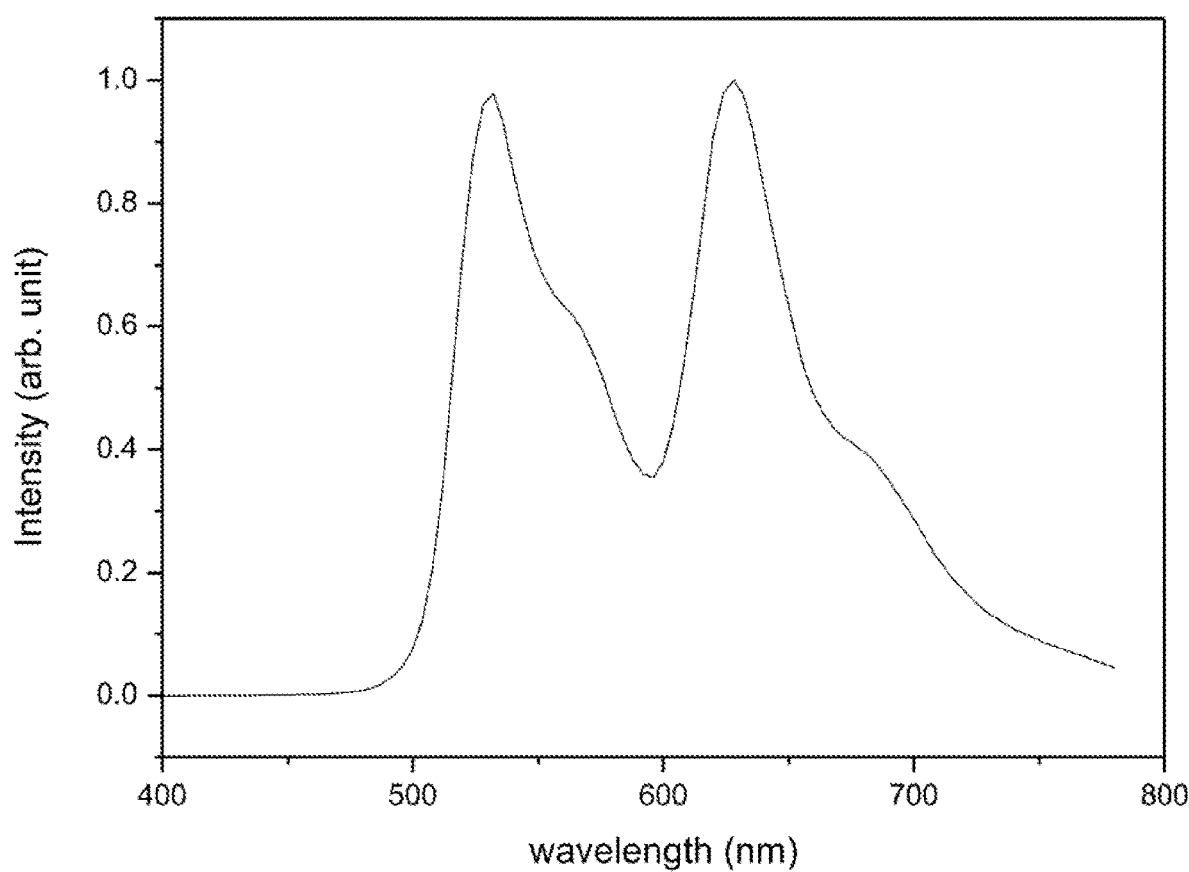
FIG. 7 shows an image of a light emitting spectrum of an organic light emitting diode device on the basis of Embodiment 4.
Figure 8:
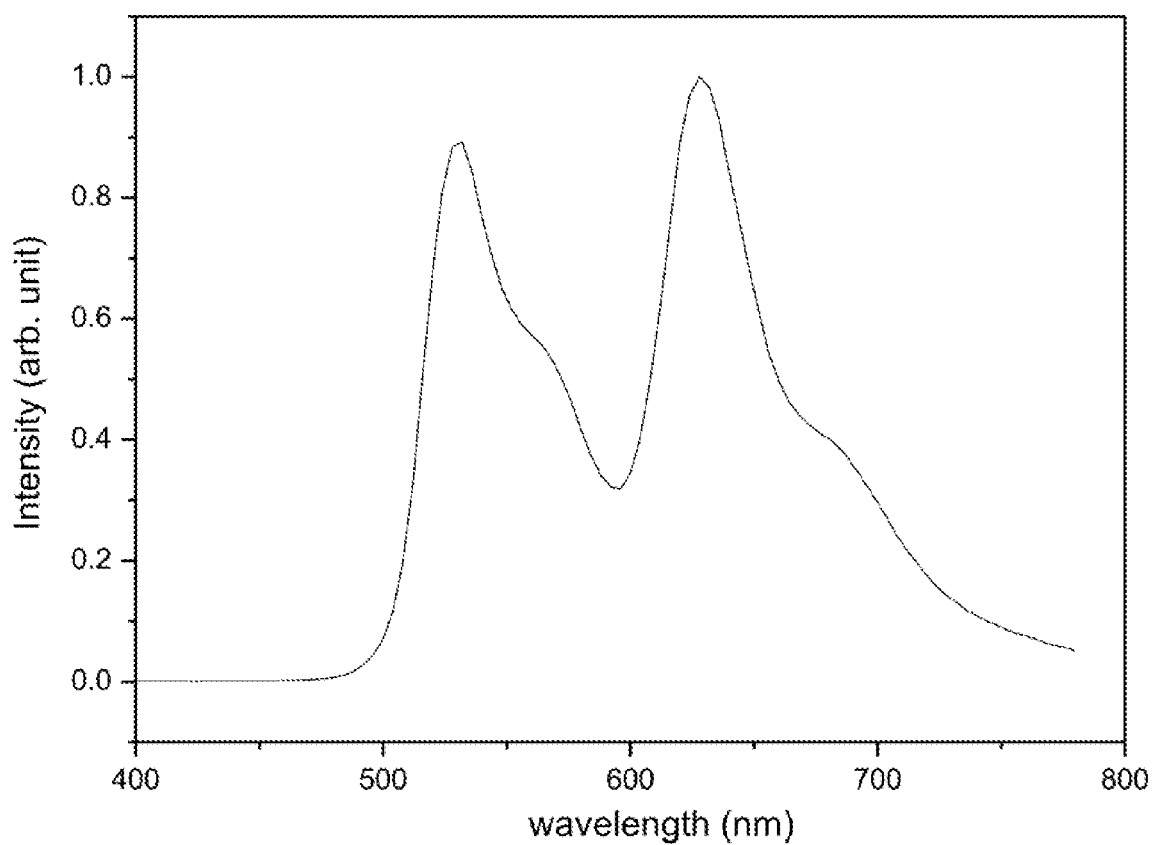
FIG. 8 shows an image of a light emitting spectrum of an organic light emitting diode device on the basis of Embodiment 5.
Figure 9:
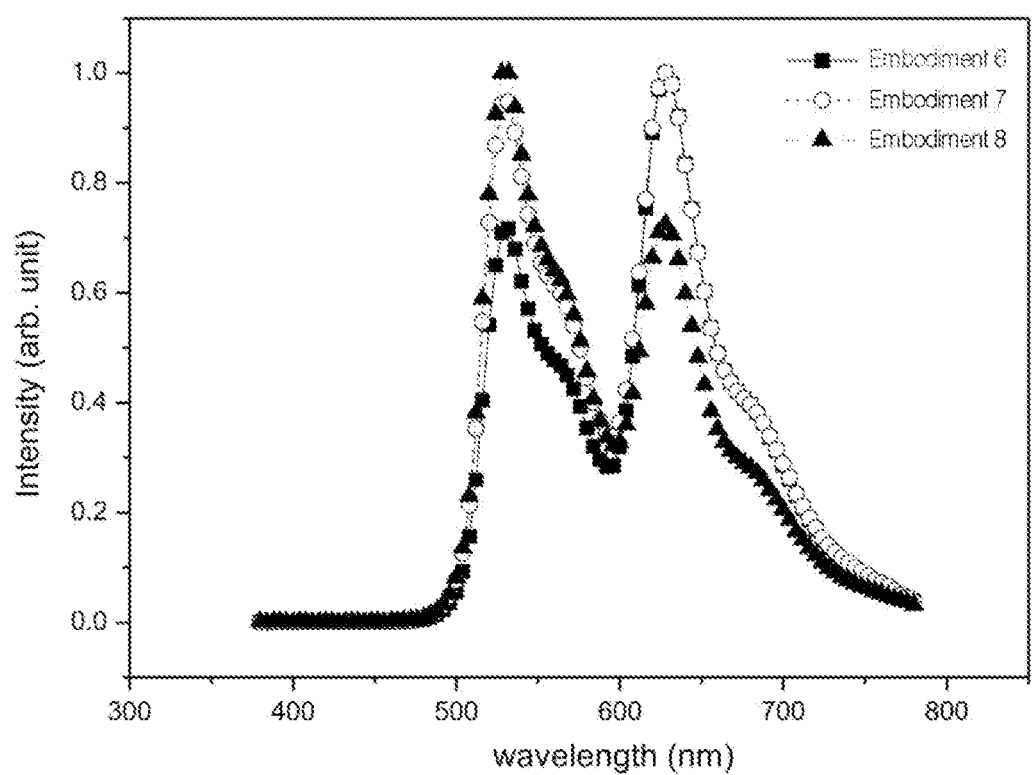
FIG. 9 shows an image of a light emitting spectrum of organic light emitting diode devices on the basis of Embodiment 6 to Embodiment 8.

FIG. 1 shows a light emitting spectrum of the organic light emitting diode device in comparative example 1.
FIG. 2 shows a light emitting spectrum of the organic light emitting diode device in comparative example 2.
FIG. 3 shows a light emitting spectrum of the organic light emitting diode device in comparative example 3.
FIG. 4 shows a light emitting spectrum of the organic light emitting diode device in embodiment 1.
FIG. 5 shows a light emitting spectrum of the organic light emitting diode device in embodiment 2.
FIG. 6 shows a light emitting spectrum of the organic light emitting diode device in embodiment 3.
FIG. 7 shows a light emitting spectrum of the organic light emitting diode device in embodiment 4.
FIG. 8 shows a light emitting spectrum of the organic light emitting diode device in embodiment 5.
FIG. 9 shows a light emitting spectrum of the organic light emitting diode devices in embodiments 6 to 8.
Table 1 below shows results of the light emitting spectrums in FIGS. 1 to 9.

TABLE 1

|  | Maximum peak intensity in green wavelength range (a.u.) | Maximum peak intensity in red wavelength range (a.u.) | Green/ red | Red/ green |
|---|---|---|---|---|
| Comparative example 1 | 0.37 | 1.00 | 0.37 | 2.70 |

TABLE 1-continued

| | Maximum peak intensity in green wavelength range (a.u.) | Maximum peak intensity in red wavelength range (a.u.) | Green/red | Red/green |
|---|---|---|---|---|
| Comparative example 2 | 0.40 | 1.00 | 0.40 | 2.50 |
| Comparative example 3 | 0.52 | 1.00 | 0.52 | 1.92 |
| Embodiment 1 | 1.00 | 0.90 | 1.11 | 0.90 |
| Embodiment 2 | 1.00 | 0.90 | 1.11 | 0.90 |
| Embodiment 3 | 0.90 | 1.00 | 0.90 | 1.11 |
| Embodiment 4 | 0.99 | 1.00 | 0.99 | 1.01 |
| Embodiment 5 | 0.90 | 1.00 | 0.90 | 1.11 |
| Embodiment 6 | 0.70 | 1.00 | 0.70 | 1.43 |
| Embodiment 7 | 0.99 | 1.00 | 0.99 | 1.01 |
| Embodiment 8 | 1.00 | 0.70 | 1.43 | 0.70 |

Table 2 below shows data on color coordinates acquired from the comparative examples and embodiments.

TABLE 2

| | CIE (x, y) |
|---|---|
| Comparative example 1 | (0.553, 0.436) |
| Comparative example 2 | (0.531, 0.455) |
| Comparative example 3 | (0.497, 0.487) |
| Embodiment 1 | (0.445, 0.535) |
| Embodiment 2 | (0.457, 0.527) |
| Embodiment 3 | (0.456, 0.526) |
| Embodiment 4 | (0.457, 0.526) |
| Embodiment 5 | (0.462, 0.520) |
| Embodiment 6 | (0.476, 0.508) |
| Embodiment 7 | (0.449, 0.531) |
| Embodiment 8 | (0.427, 0.552) |

Referring to the above table 1, the embodiments have maximum peak intensity higher than that of the comparative examples in the green wavelength range. The comparative examples had maximum peak intensity less than 0.6 a.u. (arbitrary unit) in the green wavelength range. The comparative example 1 had maximum peak intensity less than about 0.40 a.u. in the green wavelength range; the comparative example 2 had maximum peak intensity of about 0.40 a.u. or lower in the green wavelength range; the comparative example 3 had maximum peak intensity of about 0.52 a.u. or lower in the green wavelength range.

A ratio (described as "green/red" in table 1) of the maximum peak intensity of all the comparative examples in the green wavelength range to the maximum peak intensity of all the comparative examples in the red wavelength range was less than about 0.6, and a ratio (described as "red/green" in table 1) of the maximum peak intensity of all the comparative examples in the red wavelength range to the maximum peak intensity of all the comparative examples in the green wavelength range was greater than about 1.8.

Referring to the above table 1, the maximum peak intensity of the embodiments was greater than 0.6 a.u. in the green wavelength range. The embodiments 1 and 2 had maximum peak intensity of about 1.00 a.u. in the green wavelength range. The embodiment 3 had maximum peak intensity of about 0.90 a.u. in the green wavelength range, and the embodiment 4 had maximum peak intensity of about 0.99 a.u. in the green wavelength range. The embodiment 5 had maximum peak intensity of about 0.90 a.u. in the green wavelength range. The embodiments 6 to 8 had maximum peak intensity greater than about 0.6 a.u. in the green wavelength range.

A ratio (described as "green/red" in table 1) of the maximum peak intensity of all the embodiments in the green wavelength range to the maximum peak intensity of all the embodiments in the red wavelength range was greater than about 0.6, and a ratio (described as "red/green" in table 1) of the maximum peak intensity of all the embodiments in the red wavelength range to the maximum peak intensity of all the embodiments in the green wavelength range was less than about 1.5.

Specifically, a ratio (described as "green/red" in table 1) of the maximum peak intensity of the embodiments 1 to 5 in the green wavelength range to the maximum peak intensity of the embodiments 1 to 5 in the red wavelength range was greater than about 0.80 or about 0.90 or greater, and a ratio (described as "red/green" in table 1) of the maximum peak intensity of the embodiments 1 to 5 in the red wavelength range to the maximum peak intensity of the embodiments 1 to 5 in the green wavelength range was less than about 1.2 or about 1.11 or lower.

Referring to FIGS. 1 to 8, the embodiments could emit green light of higher light emission intensity than the comparative examples because of an organic combination of the red host compound and the green host compound. As the applicants estimated, this is because mobility of the holes injected into the red light emitter and mobility of the electrons injected into the green light emitter are balanced. The applicants confirmed that a color balance is achieved on the basis of the balance between the mobilities.

Further, a ratio (described as "green/red" in table 1) of the maximum peak intensity of the embodiments 6 to 8 in the green wavelength range to the maximum peak intensity of the embodiments 6 to 8 in the red wavelength range was greater than about 0.60 or about 0.70 or greater, and a ratio (described as "red/green" in table 1) of the maximum peak intensity of the embodiments 6 to 8 in the red wavelength range to the maximum peak intensity of the embodiments 6 to 8 in the green wavelength range was less than about 1.50 or about 1.43 or lower.

Referring to table 2, in the comparative examples, a CIE color coordinate x was a coordinate value equaled 0.497 or greater, and a y-coordinate value was 0.487 or lower. In the embodiments, a CIE color coordinate x was a coordinate value equaled 0.427 to 0.476, and a y-coordinate value was 0.508 to 0.552.

All the comparative examples could not reach a CIE (0.45, 0.54) level that is an optimal color coordinate, while the embodiments 1 to 5 had a coordinate value of the CIE color coordinate x that is 0.445 to 0.462, and had a y-coordinate value of the CIE color coordinate that is 0.520 to 0.535. The embodiments 6 to 8 had a coordinate value of the CIE color coordinate x that is 0.427 to 0.476, and had a y-coordinate value of the CIE color coordinate that is 0.508 to 0.552. All the embodiments reached the CIE (0.45, 0.54) level that is an optimal color coordinate.

The embodiments are described above with reference to the accompanying drawings in the present disclosure. However, they should not be construed as being limited and may be modified in various different forms on the basis of a combination of details in relation to the embodiments. Additionally, it will be apparent to one having ordinary skill in the art to which the disclosure pertains that the embodiments may be implemented in other specific forms without a change in the technical spirit or the essential features set forth herein. Thus, it should be understood that the above-described embodiments are provided as examples and are not limited in all aspects.

The various embodiments described above can be combined to provide further embodiments. All of the U.S. patents, U.S. patent application publications, U.S. patent applications, foreign patents, foreign patent applications and non-patent publications referred to in this specification and/or listed in the Application Data Sheet are incorporated herein by reference, in their entirety. Aspects of the embodiments can be modified, if necessary to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

What is claimed is:

1. An organic light emitting diode device, comprising:
    an anode;
    a cathode; and
    a light emitting layer disposed between the anode and the cathode;
    wherein:
    the light emitting layer comprises a blue light emitting layer and a red/green simultaneous light emitting stack that are stacked, the red/green simultaneous light emitting stack comprising a red light emitting layer and a green light emitting layer that are stacked;
    the green light emitting layer is disposed between the red light emitting layer and the cathode;
    the red light emitting layer comprises a red host compound and a red phosphorescence light emitting dopant compound, and the red host compound is represented by the following Compound RH-4:

(RH-4)

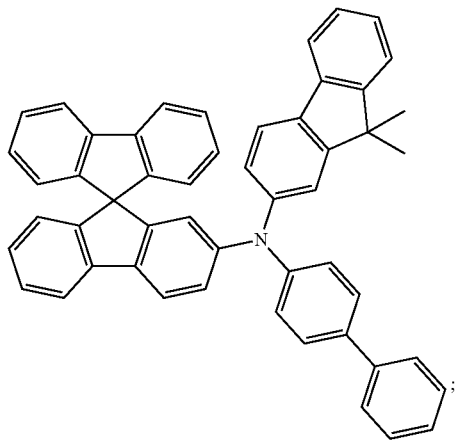

the green light emitting layer comprises a green host compound and a green phosphorescence light emitting dopant, the green host compound comprising a mixture of a first green host compound and a second green host compound;
the first green host compound is represented by the following Compound GHA-13:

(GHA-13)

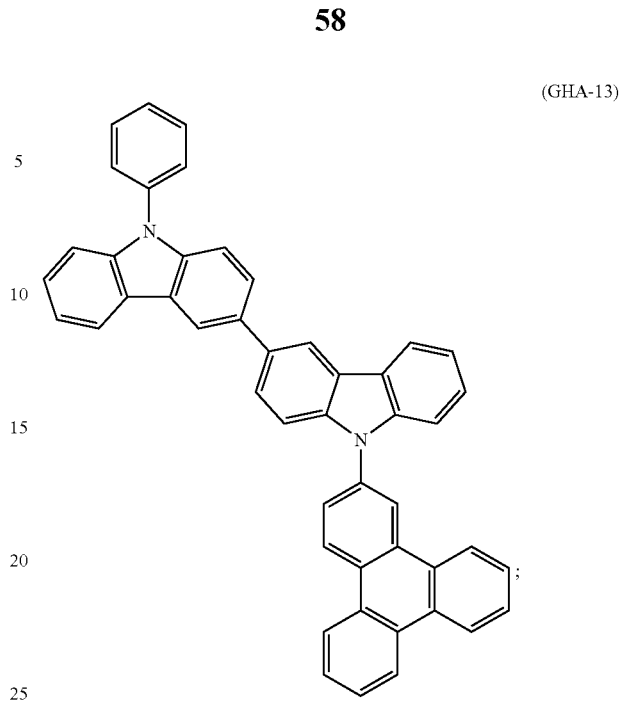

the second green host compound is represented by the following Compound GHB-1, GHB 2 or GHB 3:

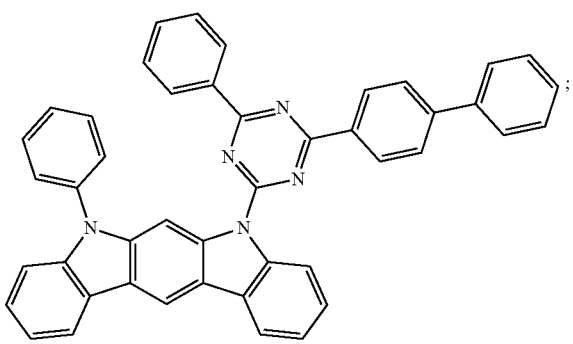 [SMILES: c1ccc(-c2ccc(-c3nc(-c4ccccc4)nc(-n4c5ccccc5c5cc6c7ccccc7n(-c7ccccc7)c6cc54)n3)cc2)cc1]

a maximum light emission wavelength of the red phosphorescence light emitting dopant is from 610 nm to 640 nm, and wherein a maximum light emission wavelength of the green phosphorescence light emitting dopant is from 510 nm to 540 nm;

a ratio of a maximum peak intensity in a green wavelength range to a maximum peak intensity in a red wavelength range exceeds 0.6, and a ratio of the maximum peak intensity in the red wavelength range to the maximum peak intensity in the green wavelength range is less than 1.8;

the green wavelength range is measured in an organic light emitting spectrum of the green light emitting layer, and the red wavelength range is measured in an organic light emitting spectrum of the red light emitting layer;

the red phosphorescence light emitting dopant compound is at least one of a compound represented by the following Chemical Formula 4 or a compound represented by the following Chemical Formula 5:

Chemical Formula 4

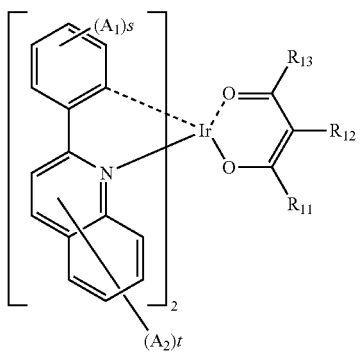

wherein:
$A_1$ and $A_2$ are independently hydrogen, heavy hydrogen, halogen, a substituted or unsubstituted $C_{1-6}$ alkyl group, a substituted or unsubstituted $C_{3-6}$ cycloalkyl group, a substituted or unsubstituted $C_{6-15}$ aryl group, a substituted or unsubstituted $C_{5-9}$ heteroaryl group, a substituted or unsubstituted carbazole group, a substituted or unsubstituted dibenzofuran group, a substituted or unsubstituted dibenzothiophene group, a substituted or unsubstituted trialkylsilyl group or a substituted or unsubstituted triarylsilyl group;
s is an integer from 1 to 4;
t is an integer from 1 to 6; and
$R_{11}$, $R_{12}$ and $R_{13}$ are independently hydrogen, a substituted or unsubstituted $C_{1-6}$ alkyl group, a substituted or unsubstituted $C_{3-6}$ cycloalkyl group or a substituted or unsubstituted $C_{6-10}$ aryl group; or $R_{11}$ and $R_{12}$ or $R_{12}$ and $R_{13}$ are connected to each other to form a ring, Chemical Formula 5

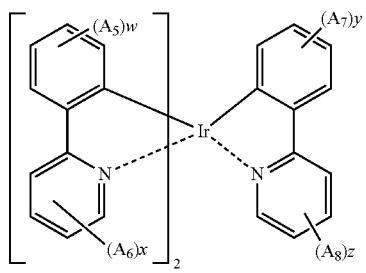

wherein:
$A_3$ and $A_4$ are independently hydrogen, heavy hydrogen, halogen, a substituted or unsubstituted $C_{1-6}$ alkyl group, a substituted or unsubstituted $C_{3-6}$ cycloalkyl group, a substituted or unsubstituted $C_{6-15}$ aryl group, a substituted or unsubstituted $C_{5-9}$ heteroaryl group, a substituted or unsubstituted carbazole group, a substituted or unsubstituted dibenzofuran group, a substituted or unsubstituted dibenzothiophene group, a substituted or unsubstituted trialkylsilyl group or a substituted or unsubstituted triarylsilyl group;
u is an integer from 1 to 4;
v is an integer from 1 to 6; and
$R_{14}$, $R_{15}$ and $R_{16}$ are independently hydrogen, a substituted or unsubstituted $C_{1-6}$ alkyl group, a substituted or unsubstituted $C_{3-6}$ cycloalkyl group or a substituted or unsubstituted $C_{6-10}$ aryl group; or $R_{14}$ and $R_{15}$ or $R_{15}$ and $R_{16}$ are connected to each other to form a ring;

the green phosphorescence light emitting dopant is at least one of a compound represented by the following Chemical Formula 6 or a compound represented by the following Chemical Formula 7:

Chemical Formula 6

[Chemical structure of Chemical Formula 6]

wherein:
$A_5$, $A_6$, $A_7$ and $A_8$ are independently hydrogen, heavy hydrogen, halogen, a substituted or unsubstituted $C_{1-6}$ alkyl group, a substituted or unsubstituted $C_{3-6}$ cycloalkyl group, a substituted or unsubstituted $C_{6-10}$ aryl group, a substituted or unsubstituted $C_{5-9}$ heteroaryl group, a substituted or unsubstituted carbazole group, a substituted or unsubstituted dibenzofuran group, a substituted or unsubstituted dibenzothiophene group, a substituted or unsubstituted trialkylsilyl group or a substituted or unsubstituted triarylsilyl group; and
w, x, y and z are independently an integer from 1 to 4, Chemical Formula 7

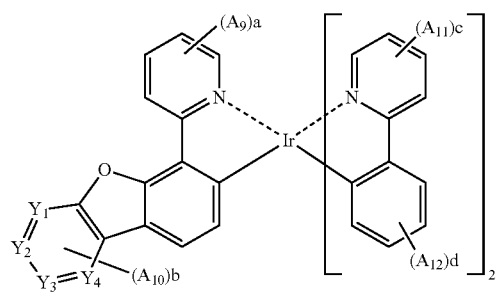

wherein:
$A_9$, $A_{10}$, $A_{11}$ and $A_{12}$ are independently hydrogen, heavy hydrogen, halogen, a substituted or unsubstituted $C_{1-6}$ alkyl group, a substituted or unsubstituted $C_{3-6}$ cycloalkyl group, a substituted or unsubstituted $C_{6-10}$ aryl group, a substituted or unsubstituted $C_{5-9}$ heteroaryl group, a substituted or unsubstituted carbazole group, a substituted or unsubstituted dibenzofuran group, a substituted or unsubstituted dibenzothiophene group, a substituted or unsubstituted trialkylsilyl group or a substituted or unsubstituted triarylsilyl group;
a, c and d are independently an integer from 1 to 4;
b is an integer from 1 to 3; and
$Y_1$, $Y_2$, $Y_3$ and $Y_4$ are independently N or CR', and R' is hydrogen, heavy hydrogen, halogen, a substituted or unsubstituted $C_{1-6}$ alkyl group, a substituted or unsubstituted $C_{3-6}$ cycloalkyl group, a substituted or unsubstituted $C_{6-10}$ aryl group or a substituted or unsubstituted $C_{5-9}$ heteroaryl group; and the blue light emitting layer comprises a blue host compound and a blue dopant compound, and the blue dopant compound includes a pyrene-based dopant compound or a boron-containing dopant compound.

2. The organic light emitting diode device of claim 1, wherein a composition ratio of the first green host compound to the second green host compound is from 3:7 to 7:3.

3. The organic light emitting diode device of claim 1, wherein a composition ratio of the first green host compound and the second green host compound is 1:1.

4. The organic light emitting diode device of claim 1, wherein a ratio of a maximum peak intensity in a green wavelength range to a maximum peak intensity in a red wavelength range exceeds 0.6, and a ratio of the maximum peak intensity in the red wavelength range to the maximum peak intensity in the green wavelength range is less than 1.5.

* * * * *